US008331651B2

(12) United States Patent
Nishiura et al.

(10) Patent No.: US 8,331,651 B2
(45) Date of Patent: *Dec. 11, 2012

(54) METHOD AND APPARATUS FOR INSPECTING DEFECT OF PATTERN FORMED ON SEMICONDUCTOR DEVICE

(75) Inventors: Tomofumi Nishiura, Kawasaki (JP);
Atsushi Miyamoto, Yokohama (JP);
Chie Shishido, Kawasaki (JP);
Takumichi Sutani, Hitachinaka (JP)

(73) Assignee: Hitachi High-Technologies Corporatiopn, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/231,394

(22) Filed: Sep. 13, 2011

(65) Prior Publication Data
US 2012/0002861 A1 Jan. 5, 2012

Related U.S. Application Data

(63) Continuation of application No. 12/350,260, filed on Jan. 8, 2009, now Pat. No. 8,045,789.

(30) Foreign Application Priority Data

Jan. 9, 2008 (JP) .................................. 2008-001762

(51) Int. Cl.
*G06K 9/00* (2006.01)

(52) U.S. Cl. ...................................................... 382/149

(58) Field of Classification Search .................. 382/141, 382/145, 147, 149
See application file for complete search history.

(56) References Cited

U.S. PATENT DOCUMENTS 7,925,095 B2 4/2011 Sugiyama et al.
8,045,789 B2 * 10/2011 Nishiura et al. .............. 382/149

FOREIGN PATENT DOCUMENTS

JP 2000-030652 1/2000
JP 2005-277395 10/2005

* cited by examiner

*Primary Examiner* — Hwa Lee
(74) *Attorney, Agent, or Firm* — Antonelli, Terry, Stout & Kraus, LLP.

(57) ABSTRACT

An apparatus and method for inspecting a defect of a circuit pattern formed on a semiconductor wafer includes a defect classifier have a comparison shape forming section for forming a plurality of comparison shapes corresponding to an SEM image of an inspection region by deforming the shape of the circuit pattern in accordance with a plurality of shape deformation rules using design data corresponding to the circuit pattern within the inspection region and a shape similar to the SEM image of the inspection region out of the plurality of comparison shapes formed and selected as the comparison shape, and a shape comparing and classifying section for classifying the SEM image using information of the comparison shape selected in the comparison shape forming section and the inspection shape of the circuit pattern of the SEM image of the inspection region.

16 Claims, 20 Drawing Sheets

FIG. 11

| SHAPE COMPARISON RESULT | MODE A<br>1101<br>RESEMBLANCE DEGREE AGAINST COMPARISON SHAPE FOR DEFECT INSPECTION ≧ th | MODE B<br>1102<br>RESEMBLANCE DEGREE AGAINST COMPARISON SHAPE FOR DEFECT INSPECTION ≧ th | MODE C<br>1103<br>RESEMBLANCE DEGREE AGAINST COMPARISON SHAPE FOR DEFECT INSPECTION < th | MODE D<br>1104<br>RESEMBLANCE DEGREE AGAINST COMPARISON SHAPE FOR DEFECT INSPECTION < th |
|---|---|---|---|---|
| EXAMPLE | 201, 302n | 201, 302n' | 201, 302n'' | 201, 302n'' |
| DEFECT KIND BY OCCURRENCE FACTOR | NO DEFECT | ABNORMAL EXPOSURE CONDITION | INFERIOR MASK | RANDOMLY OCCURRING FOREIGN MATTER |
| COUNTERMEASURE EXAMPLE | | ADJUST EXPOSURE CONDITION | ADJUST MASK OPC | FOREIGN MATERIAL CONTROL/FOREIGN MATERIAL REDUCTION |

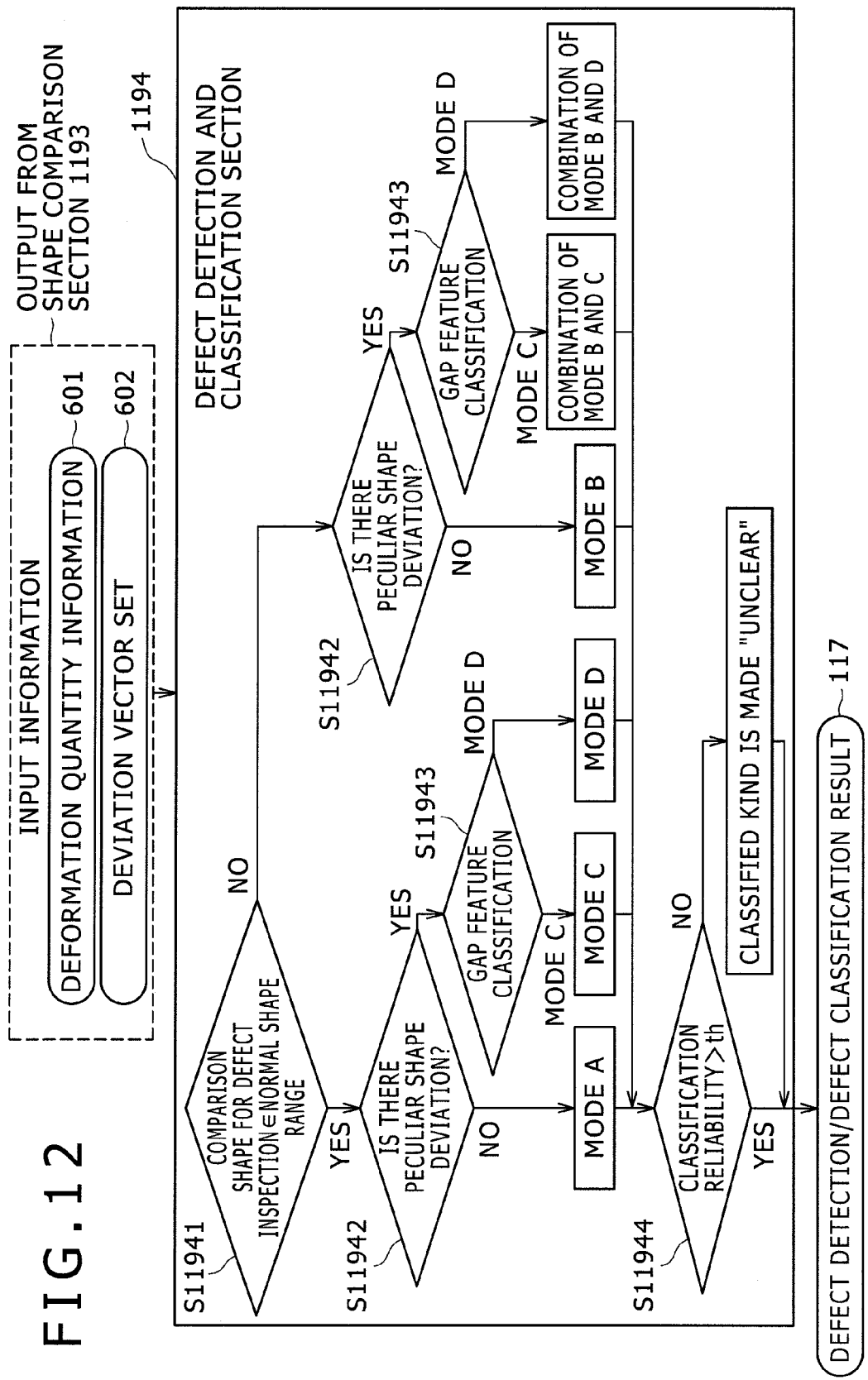

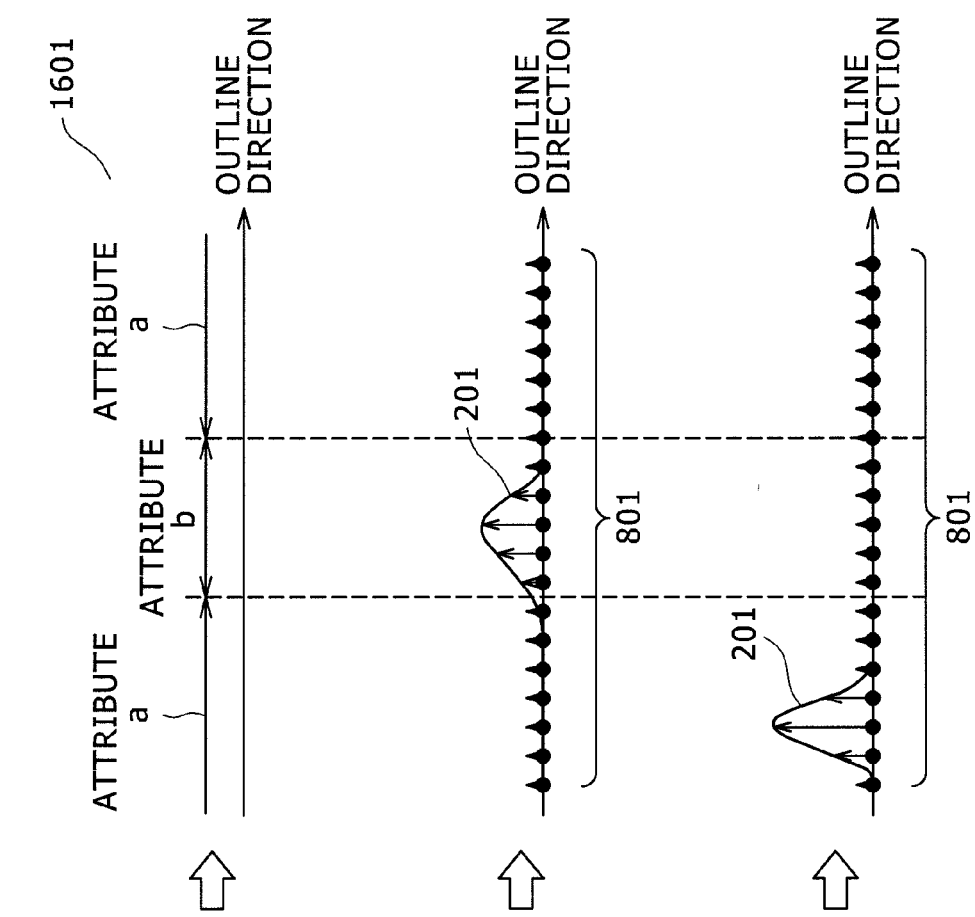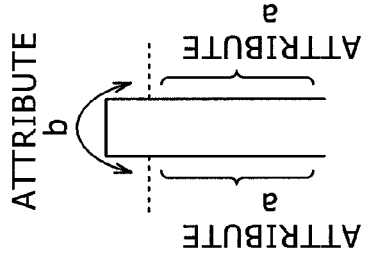

METHOD AND APPARATUS FOR INSPECTING DEFECT OF PATTERN FORMED ON SEMICONDUCTOR DEVICE

CROSS REFERENCE TO RELATED APPLICATION

This application is a continuation of U.S. application Ser. No. 12/350,260, filed Jan. 8, 2009, now U.S. Pat. No. 8,045,789, the contents of which are incorporated herein by reference.

BACKGROUND OF THE INVENTION

1. Field of the Invention

The present invention relates to an apparatus for observing in detail and classifying a defect on a semiconductor wafer detected by another inspection apparatus, in particular, relates to an apparatus and a method for inspecting a semiconductor defect for detecting patterning failure based on an image of a circuit pattern formed on the semiconductor wafer and further classifying the defect based on the defect occurrence factor.

2. Description of the Related Art

In recent years, as semiconductor circuit becomes complicated and refined in dimension, drop of yield due to frequent occurrence of patterning failure originating the manufacturing process of the semiconductor has become a problem. Also, because the factors of failures hidden in the manufacturing process are diversified, it is desired to automate the work for detecting the defect on the semiconductor wafer and determining the factor of the defect in order to inhibit the efficiency drop in developing the semiconductor wafer. In this connection, a technology for re-detecting the defect of a circuit pattern formed on a semiconductor wafer detected by another inspection apparatus is described in, for example, Japanese Unexamined Patent Application Publication No. 2000-030652.

In accordance with the method described in Japanese Unexamined Patent Application Publication No. 2000-030652, the substrate of the inspection object was photographed, an image of the inspection object pattern including a defect and an image of the reference pattern not including a defect were obtained, both images were compared, and the section where there was difference between two images was extracted as a defect. However, as refinement and densification of the circuit pattern progress, the defect of the pattern shape itself (systematic defect) which cannot be detected by comparison of image to image of such actual pattern has started to occur.

To solve this problem, a method for comparing the circuit pattern shape of an inspection object and a standard shape formed beforehand is proposed, and, as an example of it, Japanese Unexamined Patent Application Publication No. 2005-277395 is known.

Japanese Unexamined Patent Application Publication No. 2005-277395 describes a pattern inspection apparatus and a method for inspection by a pattern image of an inspection object photographed by a scanning electron microscope (hereinafter referred to as a "SEM") and information of circuit design data.

More specifically, it describes a procedure for detecting a defect with an inter-edge deviation vector obtained by comparison of a standard pattern formed by adding shrinkage and modification of roundness for corner sections with respect to circuit design data and an inspection object pattern, a procedure for performing defect classification of the defect described above by ADC (Automatic Defect Classification) on an image basis, and a procedure for computing the pattern deformation quantity such as position shift quantity and wiring width deformation quantity based on the inter-edge deviation quantity in the portion other than the defect aiming the process control.

In detecting the defect portion by comparison with the standard pattern, it is necessary to prepare, as the standard pattern, the shape without a defect determined to be normal as a device (hereinafter referred to as "a normal shape"). However, the shape regarded as normal for a device has a certain allowable range of variation in the width, roundness and the like. Therefore, even if one standard pattern is formed for comparison imitating a normal shape, as in the pattern inspection method described in Japanese Unexamined Patent Application Publication No. 2005-277395, the shape may not necessarily be suitable for detection of the defect.

Also, even if the defect inspection is performed by picking up a certain process variation (exposure condition, for example), forming a plurality of shapes to reflect its variation, and comparing with the inspection object pattern images one by one, accuracy of inspection lowers with respect to the defect originated by the process variation other than the variation picked up. In addition, with respect to the defect occurring by combination of a plurality of process variation factors, it is difficult to find out its occurrence factor.

SUMMARY OF THE INVENTION

The apparatus in relation with the present invention for inspecting a defect on a wafer based on the SEM image of a circuit pattern obtained by a SEM and corresponding design data comprises the means for performing processes (1) to (6) described below.

(1) Design data for the circuit pattern and its surroundings of the inspection objects are input and the design data are modified according to a plurality of shape deformation rules, thereby a plurality of comparison shapes (hereinafter referred to as "a comparison shape set") are formed. Then, a group of the comparison shapes and images of actual SEM observation of the circuit pattern of the inspection objects (hereinafter referred to as "an inspection object circuit pattern") are compared one by one, and the shape most similar to the inspection object circuit pattern is selected from the comparison shape set as a comparison shape used for defect inspection (hereinafter referred to as "a comparison shape for defect inspection"). Finally, deviation quantity of the shape between the shape of the inspection object circuit pattern and the comparison shape for defect inspection (hereinafter referred to as "shape deviation quantity") is computed, and the defect is detected using either one or both of the information on the deformation added to the comparison shape for defect inspection (hereinafter referred to as "deformation quantity information") and the shape deviation quantity.

The shape deformation rules are characterized in being set for respective defect occurrence factor supposed (hereinafter referred to as "a supposed defect occurrence factor"), and, more specifically, are shape deforming methods and the ranges of the deformation quantity and steps of the shape deformation. The supposed defect occurrence factor includes variation of exposure condition (the defect caused by this factor is hereinafter referred to as "an abnormal exposure condition defect") and an error in an overlay position occurring between layers of a semiconductor wafer (the defect caused by this factor is hereinafter referred to as "an overlay position error defect"), and the shape deformation rules can be set on any number of supposed defect occurrence factors.

Detection of the defect is characterized to be performed according to the condition assigned to either one or both of the deformation quantity information and the shape deviation quantity for defect detection (hereinafter referred to as "a defect detection rule"). Also, the defect detection rule is characterized to include a rule wherein the range for a normal shape stipulated for the comparison shape set (hereinafter referred to as "normal shape range") is stipulated and is made a criterion whether the comparison shape for defect inspection is included in the normal shape range. Further, the normal shape range is represented by a boundary stipulated on the space of the shape variation formed by the shape deformation according to the respective shape deformation rule.

A normal circuit pattern has an allowable range of a certain degree, therefore it is difficult to judge a defect by comparison with one comparison shape. Also, the factor of shape deformation is not one but combination of a plurality of defect occurrence factors in general, therefore, it is difficult to presume the shape variation based on one rule. In order to address such problem, variation of the normal shape is formed taking the supposed defect occurrence factor into consideration, thereby it becomes possible to detect even the defect caused by combination of a plurality of factors with high accuracy.

(2) By comparison of the comparison shape for defect inspection obtained in (1) described above and the inspection object circuit pattern, the defect occurred on the inspection object circuit pattern is classified according to respective occurrence factor.

In the classification, either one or both of the deformation quantity information and the shape deviation quantity are used. Also, classification of the defect is characterized to be performed according to the condition assigned to either one or both of the deformation quantity information and the shape deviation quantity for defect classification (hereinafter referred to as "a defect classification rule"). In the present invention, the object of the classification includes (a) one or more supposed defect occurrence factor or (b) a defect occurrence factor not supposed (hereinafter referred to as "a non-supposed defect occurrence factor").

With reference to (a), formation of the comparison shape is performed in accordance with one or more shape deformation rules and the shape deformation rules are linked with the supposed defect occurrence factor, therefore degree of shape deformation of the inspection object circuit pattern according to the respective supposed defect occurrence factor can be presumed when the comparison shape for defect inspection against the inspection object circuit pattern is determined, and the classification becomes possible.

With reference to (b), if the shape deviation quantity is large, it is possible to presume that the inspection object circuit pattern includes a supposed defect occurrence factor.

(3) With reference to the items (1) and (2), as the shape deviation quantity, a row of deviation vectors, for example, along an outline between the inspection object circuit pattern and the comparison shape for defect inspection (hereinafter referred to as "a deviation vector set") are computed, and the defect is detected or classified by the deviation vector set.

In inspecting the defect, whether the comparison shape for defect inspection is included within the normal shape range is to be made a criterion, but in addition, even if the comparison shape for defect inspection is within the normal shape range, it can be judged to be a defect in accordance with the deviation vector set.

In classification of the defect, the defect classified as (b) non-supposed defect occurrence factor in the item (2) can be classified to further detailed classes with a criterion of the deviation vector set. The detailed classes include, in addition to the defect the user cannot suppose of at all, the defect which can be supposed of but cannot be incorporated as a shape deformation rule (random occurrence defect and shape deformation by an optical proximity effect which cannot be assumed with high accuracy by simulation, and the like, for example).

(4) The shape deformation in the items (1) and (2) is performed by enlargement and reduction of pattern width, enlargement and size reduction of the entire pattern shape isotropically or in a specific direction, or addition of roundness at corner sections and the like with respect to the design data.

With respect to the shape deformation caused by the supposed defect occurrence factor, presumption of the shape, for example, by exposure simulation and the like would be possible with a comparison shape set formed with variation of the exposure condition made as a defect occurrence factor, however it generally requires the processing cost. Therefore, it is useful to imitate the pattern shapes which can be actually formed, by simple image processing such as rounding the corner sections described above.

(5) In the item (1) or (2), the user specifies the range of the deformation quantity and the steps for shape deformation.

In accordance with the present invention, the user can adjust the density of the shape variation in formation of the comparison shape set, and reflection of the user's needs in trade-off of the inspection time and inspection accuracy becomes possible.

(6) In formation of the comparison shape set in the item (1) or (2), light intensity distribution computed by exposure simulation is used.

In accordance with the present invention, deformation of the circuit shape by variation of the exposure condition can be reproduced more faithfully, which leads to improvement of accuracy in defect inspection.

According to the present invention, the following effects can be realized.

(1) Even for the defect where a plurality of factors are combined, detection of the defect or classification according to respective occurrence factor becomes possible, and failure remedy can be made speedy.

(2) Even if a defect caused by a non-supposed factor is mixed in, more detailed classification can be performed by analysis of the shape deviation at the defect portion extracted accurately.

(3) Automatic classification of large numbers of SEM images according to respective defect occurrence factor becomes possible with the circuit pattern images and circuit design data, which leads to speedy failure remedy.

These and other objects, features and advantages of the invention will be apparent from the following more particular description of preferred embodiments of the present invention, as illustrated in the accompanying drawings.

BRIEF DESCRIPTION OF THE DRAWINGS

FIG. 11 is a table showing the kind of a defect mode.

FIG. 12 is a drawing showing the process flow for the defect detection and classification section.

FIG. 16A is a drawing showing an example of attribute information which may be used together at the point obtained by the design data, FIG. 16B is a drawing showing a shape deviation example (1) and its attribute information, and FIG. 16C is a drawing showing a shape deviation example (2) and its attribute information.

DESCRIPTION OF THE PREFERRED EMBODIMENTS

The preferred embodiments of the present invention will be described below. In the present invention, number of the defect occurrence factors which can be made the object of extraction is any number, and the object of detection or classification is not limited to a specific defect occurrence factor. In the present invention, as Embodiment 1, firstly, the embodiment will be described wherein variation of exposure condition is made a supposed defect occurrence factor and detection and classification are performed with respect to the defect kinds including an abnormal exposure condition defect. Next, as Embodiment 2, the embodiment will be described wherein variation of exposure condition and error in an overlay position occurring between layers are made supposed defect occurrence factors and detection and classification are performed with respect to the defect kinds including an abnormal exposure condition defect and an overlay position error defect. Finally, as Embodiment 3, the embodiment will be described wherein detection and classification of the defect are performed while the number of the supposed defect occurrence factors is made an optional number.

Embodiment 1

As Embodiment 1, an embodiment will be described wherein variation of exposure condition is made a supposed defect occurrence factor and detection and classification according to the respective occurrence factor of the defect are performed.

[Total Parts Constitution]

Figure 1:
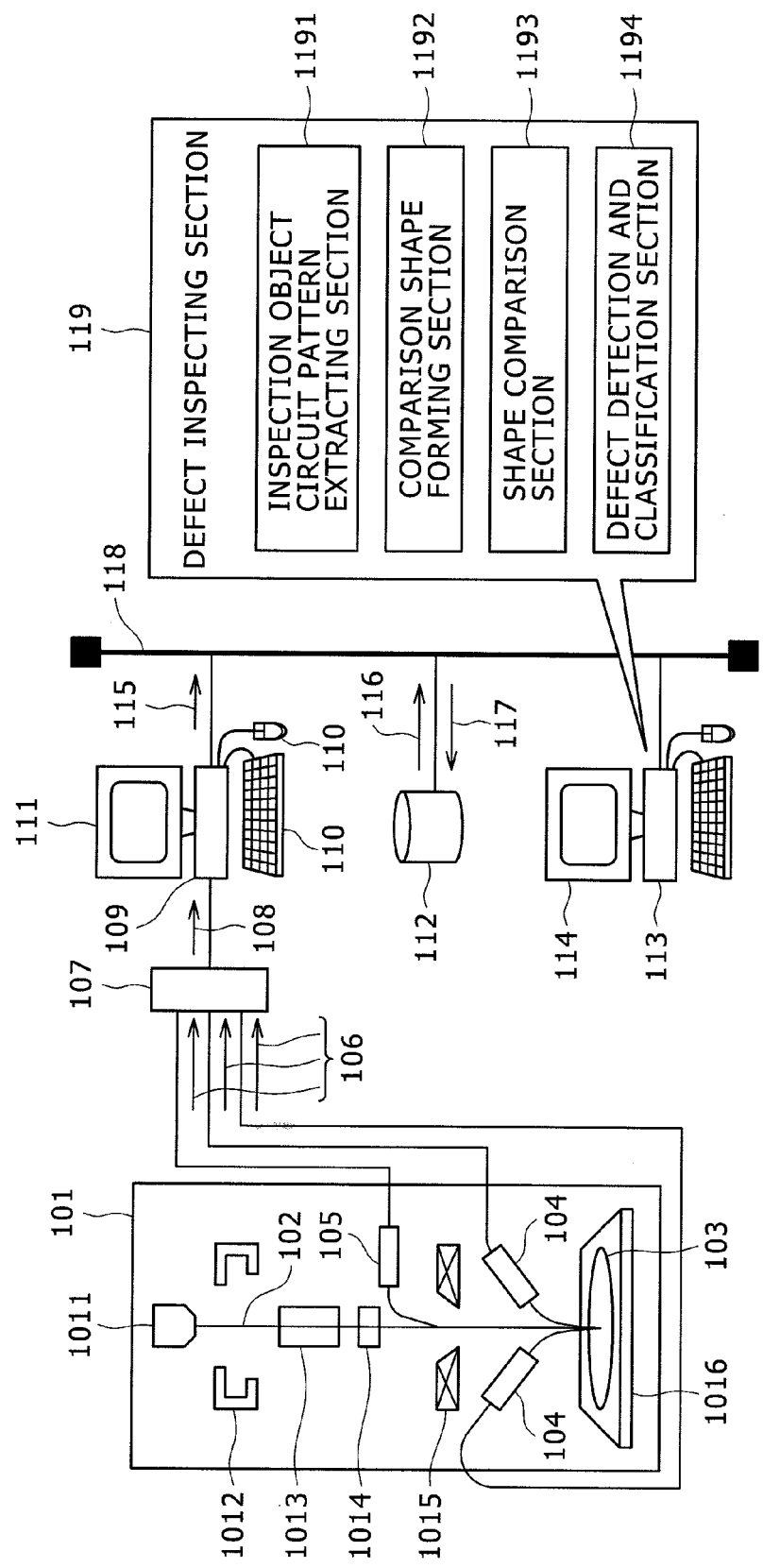
FIG. 1 is a block diagram showing schematic constitution of the defect inspection apparatus.

FIG. 1 is a schematic constitution drawing of the defect inspection apparatus with a SEM for detection and classification of the defect on a semiconductor wafer in accordance with an embodiment of the present invention.

101 is a SEM comprising in its inside; an electron source 1011, an extraction electrode 1012 for extracting an electron emitted from the electron source 1011 by desired acceleration energy in a beam shape, scanning electrodes 1013, 1014 for scanning an electron beam 102 extracted by the extraction electrode 1012 by the desired acceleration energy in a beam shape two-dimensionally in X or Y direction, a lens electrode 1015 for adjusting the focusing position of the electron beam 102 in order to converge the electron beam 102 onto the substrate surface, a table 1016 for mounting a sample semiconductor wafer 103 and movable in a two-dimensional plane or three-dimensional space, and detectors 104 and 105 for detecting a secondary charged particle such as a secondary electron and a reflected electron generated from the semiconductor wafer 103 irradiated with the electron beam 102. Also, the electron source 1011, extraction electrode 1012, scanning electrodes 1013, 1014, lens electrode 1015, and table 1016 are respectively connected to a computer 109 and are controlled by the computer 109, however, exhibition of the state of the connection is omitted in FIG. 1.

In the SEM 101 equipped with the constitution described above, the computer 109 controls the electron beam 102 to be irradiated onto the circuit pattern in the region including the inspection object defect of the semiconductor wafer 103 using the position information of the defect on the semiconductor wafer 103 detected by another inspection apparatus beforehand, and either one or both of the secondary electron and reflected electron emitted by the irradiated electron are detected by the detectors 104, 105. The detected electron is converted to an electric signal 106, and the electric signal 106 is converted to digital data 108 by an A/D converter 107. Further, the digital data 108 are input to the computer 109, converted to image information (the image is hereinafter referred to as "an inspection object circuit pattern image", and a low magnification SEM image of the circuit pattern of the inspection object is obtained. The defect is detected by comparing the obtained low magnification SEM image with the low magnification reference image in the computer 109.

Then, the SEM 101 is controlled by the computer 109 to change the enlarging magnification of the SEM image to be photographed, a high magnification SEM image of the defect previously detected is obtained, an enlarged image of the defect position is extracted by comparing the obtained high magnification SEM image with a high magnification reference image in the computer 113, and the defect is classified by processing the enlarged image of the defect position extracted. In this connection, detection of the defect by comparing the low magnification SEM image with the low magnification reference image may be performed by the computer 113 instead of the computer 109.

The computer 109 is an information processor such as a personal computer and work station, and performs a plurality of processes including at least controlling of the SEM 101 through a user's operation of an input device 110 such as a mouse and keyboard, image processing for the circuit pattern image, and displaying of the circuit pattern image or the image after processing on a display 111.

112 is a storage device, 113 is a computer equipped with a display 114 comprising a defect inspection process section 119 in its inside, and each of them are connected to the computer 109 through a LAN 118.

[Summary of Defect Inspection Process Section]

In the defect inspection process section 119 included in the computer 113, an inspection object circuit pattern image 115 shaped by the high magnification SEM image formed by the computer 109 and circuit design data 116 corresponding to the photographing portion of the high magnification SEM image stored in the storage device 112 are input, defect detection and classification are performed, and the defect detection result, defect classification result, or defect detection/defect classification result comprising both 117 in the storage device 112 are stored. The data concerning processing of the defect inspection process section are transferred between the computer and storage device through the LAN 118.

Also, the storage device for storing the circuit design data and the storing device storing the defect detection/defect classification result 117 may not necessarily be one and the same. Further, a portion or all of these storing devices may be built in the computer 109. Furthermore, an inspection result 117 may be displayed on the display 114 by a window display program or may be arranged to be printed out on a paper. In addition, the computer 109 and computer 113 are not necessarily to be separate but may be one and the same.

The defect inspection process section 119 detecting and classifying the defect using the high magnification SEM image and high magnification reference image is constituted comprising an inspection object circuit pattern extraction section 1191, a comparison shape forming section 1192, a shape comparison section 1193, and a defect detection and classification section 1194. Respective constituting element of the defect inspection process section 119 will be described below.

[Inspection Object Circuit Pattern Extraction Section]

Figure 2:
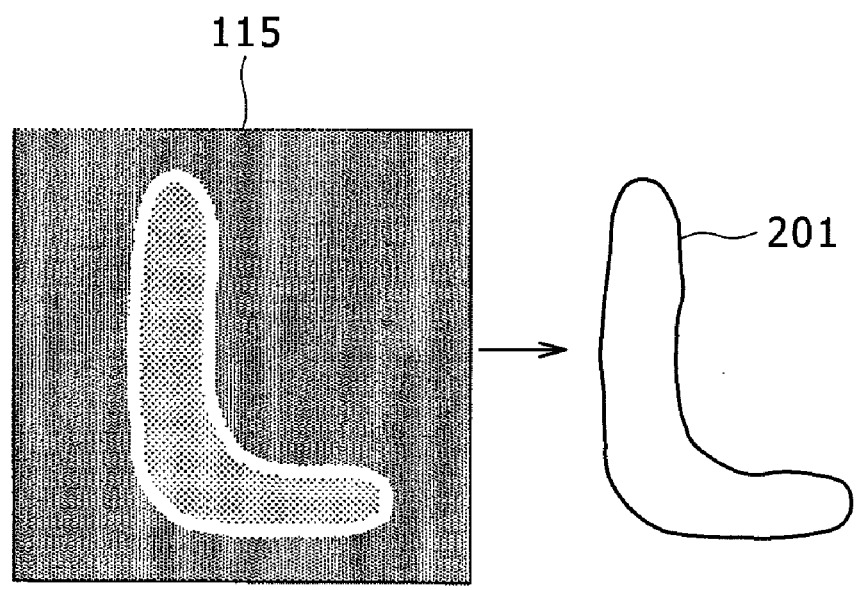
FIG. 2 is an image of a pattern explaining the process for extracting the pattern edge from an inspection object circuit pattern image.

The inspection object circuit pattern extraction section 1191 extracts a shape 201 of the inspection object circuit pattern (hereinafter referred to as "an inspection object circuit pattern 201") from the inspection object circuit pattern image 115 as shown in FIG. 2. Edge extraction is carried out by emphasizing the outline by applying an image filter such as an edge extraction filter on the inspection object circuit pattern image and performing a binarization process and a line thinning process as described, for example, in Japanese Unexamined Patent Application Publication No. 07-170395 and Japanese Unexamined Patent Application Publication No. 10-13854.

[Comparison Shape Forming Section]

The comparison shape forming section 1192 modifies the design data according to a plurality of the shape deformation rules and forms the comparison shape set. A normal circuit pattern has an allowable range to a certain degree, therefore it is difficult to judge a defect by comparing with one comparison shape. Also, the factor of shape deformation is not one in general but combination of a plurality of the defect occurrence factors, therefore, it is difficult to presume the shape variation from a single rule. In order to address such problem, in the comparison shape forming section 1192, normal shape range is formed taking the supposed defect occurrence factor into consideration, thereby enabling to detect and classify even the defect caused by combination of a plurality of factors with high accuracy by a defect detection and classification procedure described below.

Below, a method (1-1) to (1-3) for forming the comparison shape set on the basis of variation of the exposure condition with the variation of the exposure condition made the supposed defect occurrence factor will be described.

(1-1) Method for Adding Geometrical Deformation to Design Data

In order to obtain the comparison shape considering variation of the exposure condition, usage of exposure simulation and the like might be possible for formation of the comparison shape, however it generally requires the processing cost. Therefore, it is useful to imitate the pattern shapes which can be actually formed by simple image processing such as rounding the corner sections described above.

Figure 3:
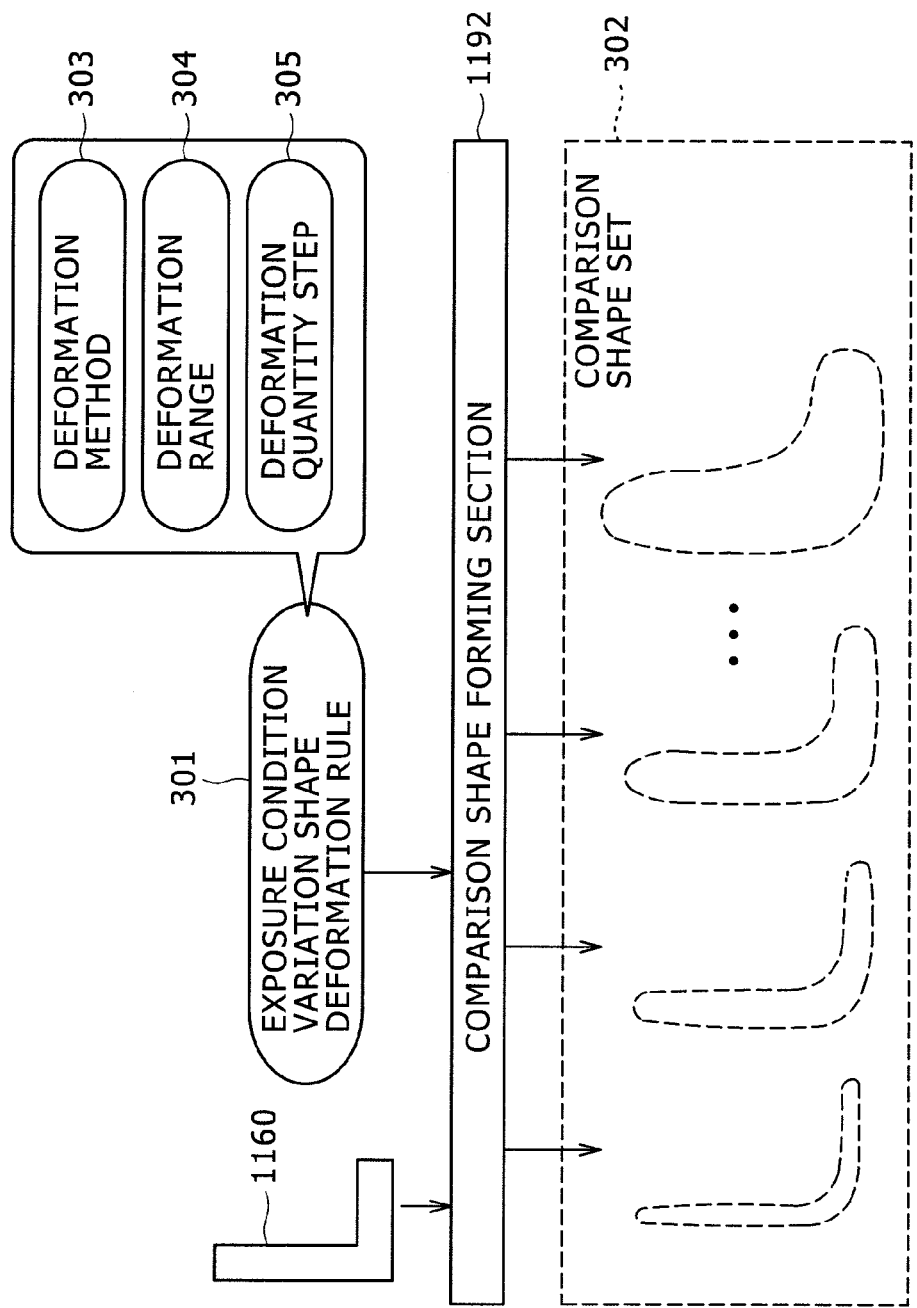
FIG. 3 is a flow diagram explaining the process flow in comparison shape forming section.

Firstly, as shown in FIG. 3, the circuit pattern shape 1160 formed on the basis of the circuit design data is processed by comparison shape forming section 1192 to form the comparison shape set 302. Here, formation of the comparison shape set 302 is performed by enlargement and reduction of the pattern width, enlargement and size reduction of the entire pattern shape isotropically or in a specific direction, or addition of roundness at the corner sections and the like with respect to the circuit pattern shape 1160 formed based on the inspection object circuit design data.

The shape deformation rule linked with variation of the exposure condition (hereinafter referred to as "an exposure condition variation shape deformation rule") 301 comprises rules for determining the shape such as a deformation method 303 of expansion or shrinkage, alteration of width and length of the circuit pattern as well as curvature of roundness applied to corners, and the like on the basis of the circuit pattern shape 1160 formed based on the circuit design data, range of deformation 304 for respective deformation procedure, and deformation quantity step 305.

Figure 4:
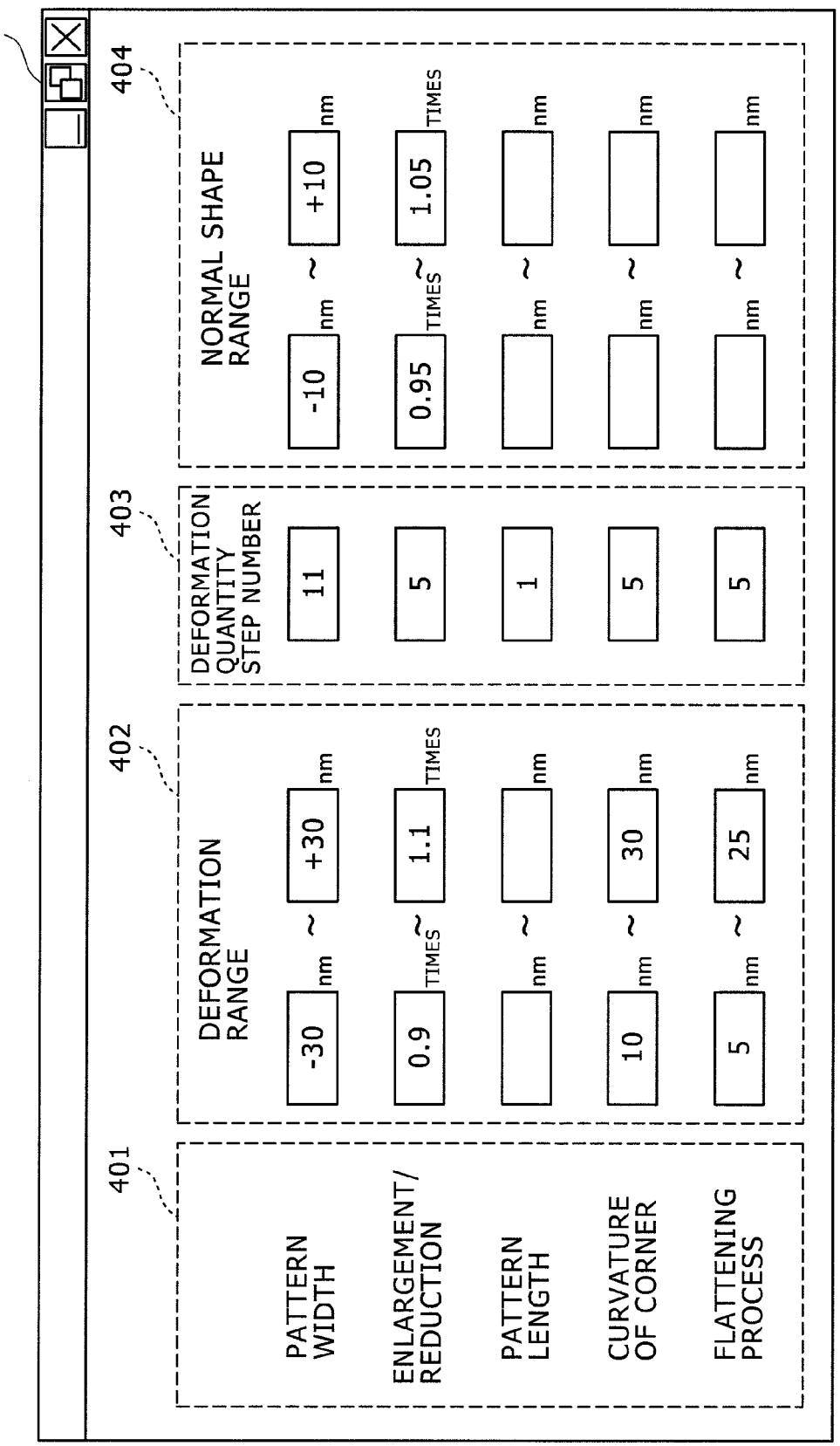
FIG. 4 is a drawing showing a deformation quantity specifying GUI.

FIG. 4 shows an example of a GUI 400 allowing the user to specify the exposure condition variation shape deformation rule 301 on the display 114. For respective deformation item 401, the user inputs the range 402 where deformation is applied, number of steps of deformation quantity 403, and range 404 regarded as normal for a device. For example, with respect to setting of the pattern width, it is shown to form the comparison shapes including a shape whose pattern width is narrowed by 30 nm, a shape widened by 30 nm from the circuit pattern shape 116 formed in accordance with the circuit design data, and 9 numbers of shapes to interpolate between them. Also, the lower limit of the shape regarded as normal among them is set as −10 nm and the upper limit is set as +10 nm. Here, the upper limit value or lower limit value for a certain deformation means may be varied responding to the deformation quantity of other deformation means. Thus, by user's specifying of the range and steps of the deformation quantity of shape variation in forming the comparison shape set 302, reflection of the user's needs in the trade-off of the inspection time and inspection accuracy becomes possible.

(1-2) Method for Utilizing Light Intensity Distribution by Optical Simulation

Figure 5:
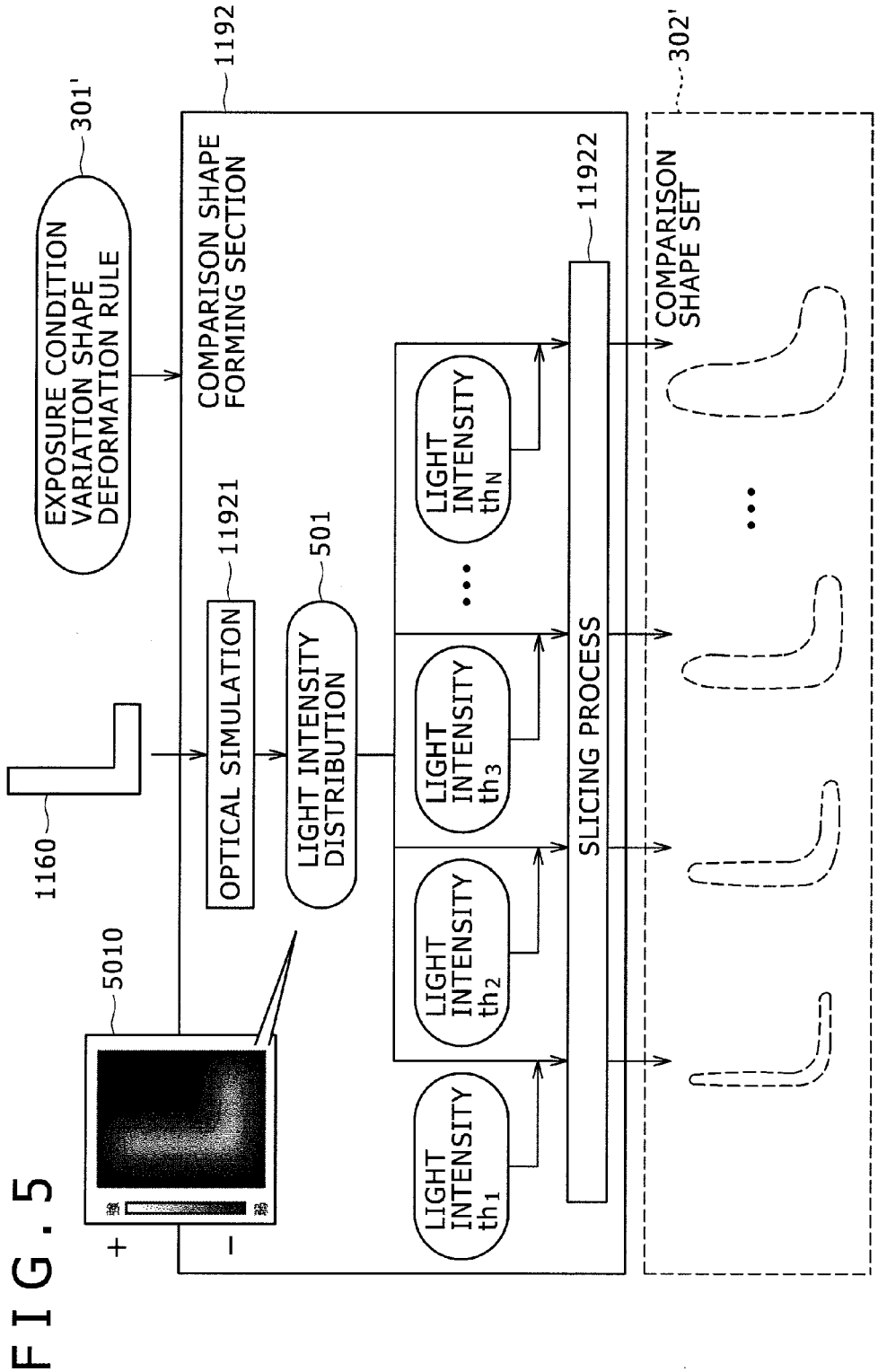
FIG. 5 is a flow diagram explaining the flow of a comparison shape forming process by optical simulation.

If faithful reproduction of the circuit pattern formed and improvement of accuracy of defect inspection are regarded important, in forming the comparison shape set, light intensity distribution computed by exposure simulation may be used. This method will be described referring to FIG. 5. First, the light intensity distribution 501 at the time of exposure is obtained by optical simulation 11921 in the comparison shape forming section 1192 based on the circuit design data 116. A light intensity distribution image 5010 is the light intensity distribution 501 imaged. Then, by performing a slicing process S11921 with a plurality of light intensity on the light intensity distribution 501, a plurality of comparison shapes (a comparison shape set 302') can be obtained.

At this time, the light intensity distribution for slicing (values th1, th2, ... thN in FIG. 5) is recorded as an exposure condition variation shape deformation rule 301'. By adding, then, the range of the light intensity distribution (the upper limit value and lower limit value) for providing the shape judged as normal for a device, judgment whether the inspection object circuit pattern includes an abnormal exposure condition defect or not becomes possible in the defect detection and classification process described below.

Figure 18:
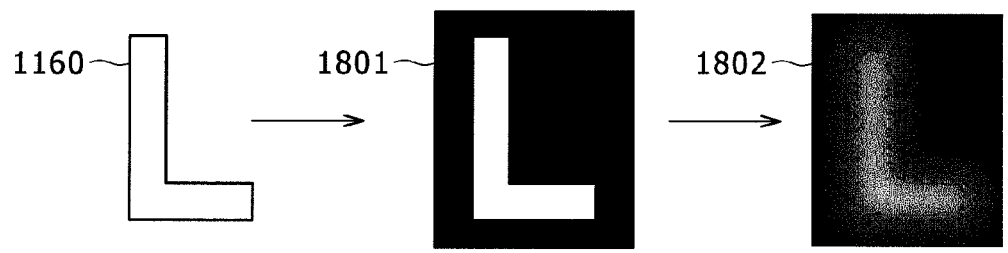
FIG. 18 is a drawing showing a method for computing false light intensity distribution conveniently.

(1-3) Method for Utilizing False Light Intensity Distribution Obtained by Image Processing In the method described in above (1-2), in order to perform the comparison shape set forming process conveniently and speedy, as shown in FIG. 18, a multi-valued image 1802 formed by imaging mask data 1801 added with remaining information on the circuit pattern shape 116 formed based on the circuit design data and applying image processing imitating optical simulation (flattening process and the like) can be used instead of the light intensity distribution image 5010. Also, in order to make the comparison shape more similar to the SEM image, the shapes deformed by electron beam simulation from the shapes obtained by a slicing process 11922 may be used as a comparison shape set 302'.

[Shape Comparison Section]

Figure 7:
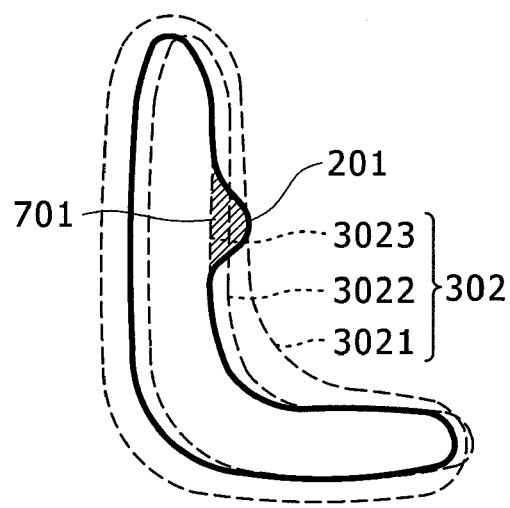
FIG. 7 is a drawing showing a matching process.

The shape comparison section 1193 performs processes for comparing respective shape of the comparison shape set and the inspection object circuit patterns one by one and selecting one which is most similar to the inspection object circuit pattern out of the comparison shape set as the comparison shape for defect inspection. More specifically, the processes are characterized in selecting an appropriate comparison shape so that both shapes of the inspection object circuit pattern and the comparison shape coincide as much as possible in the portion other than that where a peculiar shape deviation occurs. For example, in FIG. 7, one comparison shape 3021 of the comparison shape set 302 differs in the circuit thickness and cannot extract only the defect portion, therefore this shape cannot be used for defect inspection and classification. Also, one comparison shape 3022 of the comparison shape set 302 requires adjustment of matching position so that the portion other than the defect is matched. On the other hand, one comparison shape 3023 of the comparison shape set 302 is matched in the shape in the portion other than the circuit thickness and defect respectively, therefore it is desirable to perform analysis of the defect portion by the defect deviation of that time.

Figure 6:
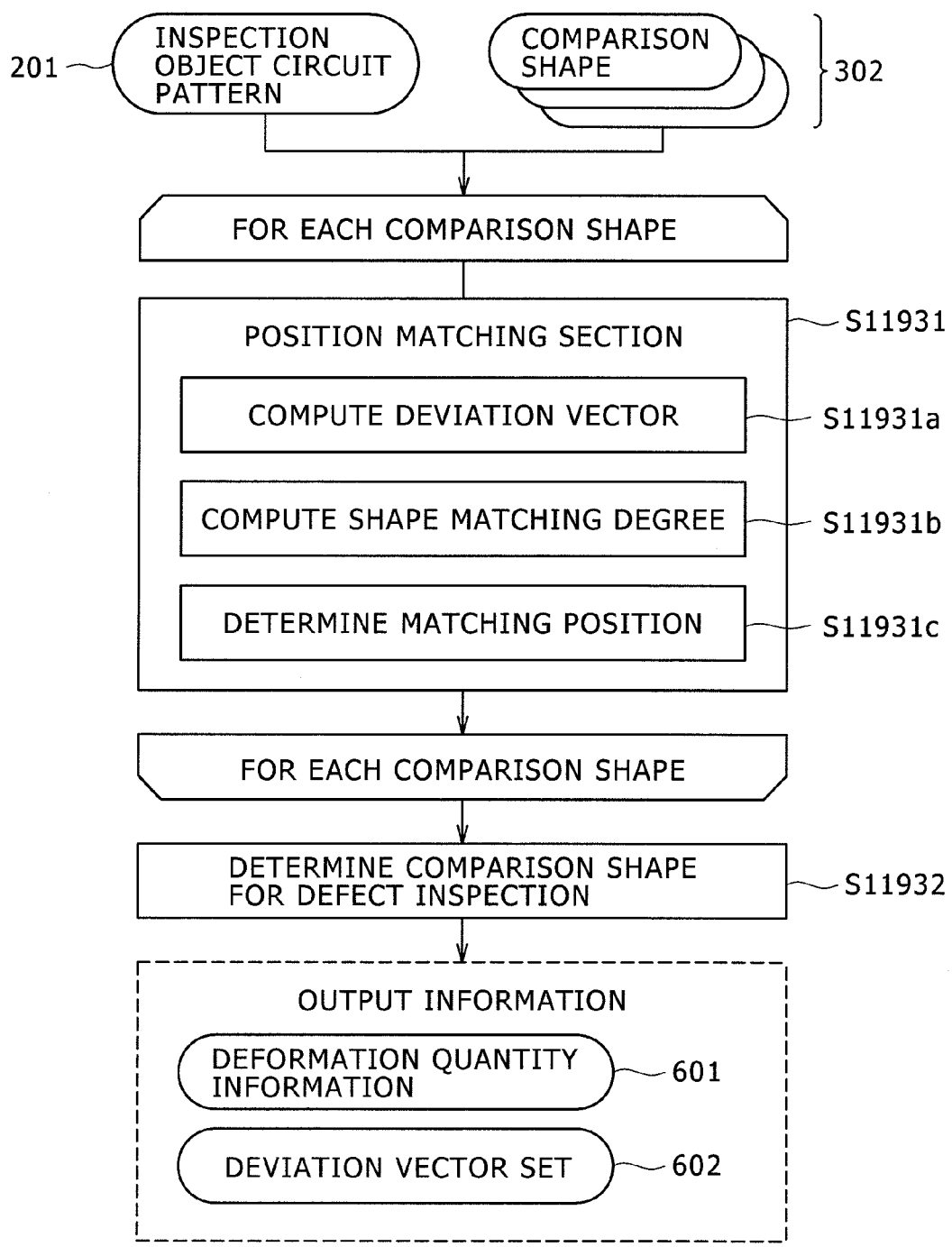
FIG. 6 is a flow diagram explaining the procedure for a shape comparison process.

An embodiment of the shape comparison process as above will be described referring to the process flow shown in FIG. 6. First, in a position matching process S11931 of the shape comparison section 1193, processes such as a deviation vector computation process S11931*a*, a shape matching degree computation process S11931*b* and matching position determining process S11931*c* are performed, and the process for position matching with the inspection object circuit pattern 201 is performed on respective point on the outline of the respective shape of the comparison shape set 302.

Figure 8:
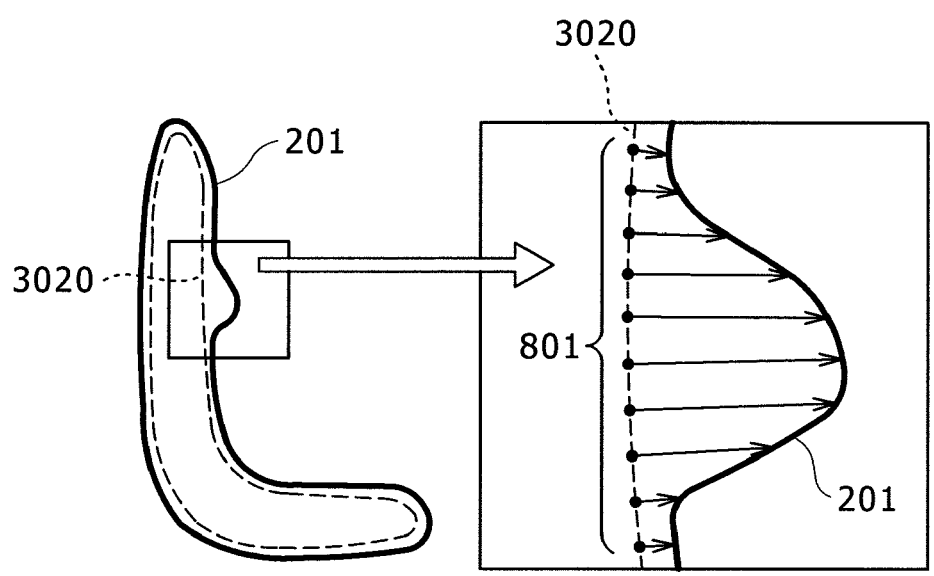
FIG. 8 is an explanatory drawing for a deviation vector computing process.

As shown in FIG. 8, the deviation vector computation process S11931*a* is the process for computing the deviation vector set 801 obtained by associating one comparison shape 3020 of the comparison shape set 302 and the inspection object circuit pattern 201 (edge association). With respect to the method for edge association, a method can be cited wherein a point on the comparison shape 3020 is made the vector start point and the point of intersection of the normal of the outline at the start point and the inspection object circuit pattern 201 is made the vector end point.

The shape matching degree computation process S11931*b* is the process for computing the degree of matching (hereinafter referred to as "shape matching degree") between the shapes of the inspection object circuit pattern 201 and the comparison shape 3020 at a certain matching position candidate. At that time, the shape matching degree is characterized in being calculated excluding the portion where a local shape deformation is caused by the defect and is the magnitude of deviation between the outlines of the inspection object circuit pattern and the comparison shape in the portion other than the excluded portion.

Figure 9:
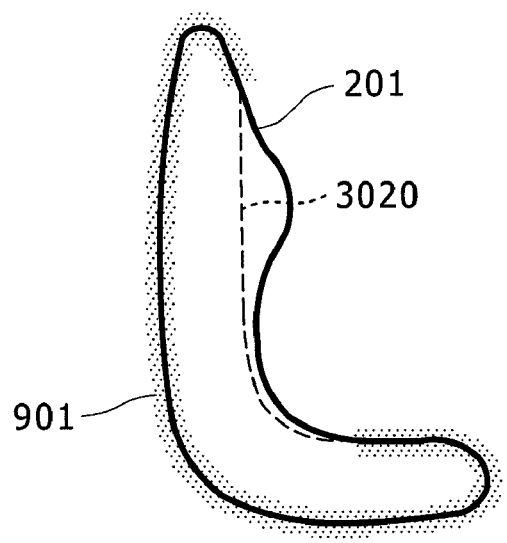
FIG. 9 is an explanatory drawing of the computing process for the degree of shape matching.
Figure 10:
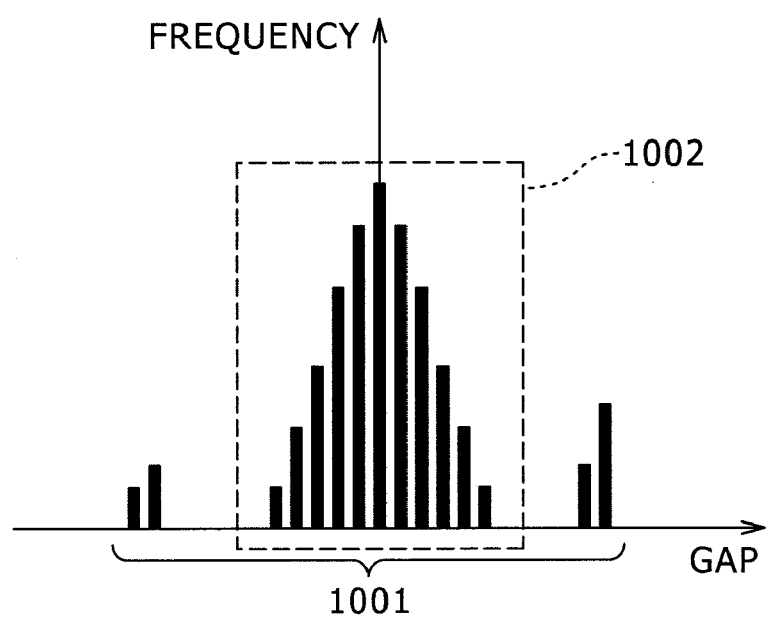
FIG. 10 is an explanatory drawing of the computing process for the degree of shape matching.

With respect to the embodiments for realizing the process, (1) a method wherein the shape matching degree is defined as the total of the dimension of the deviation vector set after exclusion of the vector having peculiar dimension, (2) a method as shown in FIG. 9 wherein the edge portion wherein the dimension of the deviation vector is less than a predetermined threshold value out of the comparison shape 3020 is extracted as a shape matching edge 901, and the shape matching degree is defined as the percentage of the shape matching edge 901 against the comparison shape 3020, and (3) a method as shown in FIG. 10 wherein a histogram 1001 of the dimension of the deviation vector is formed, and the shape matching degree is defined as the inverse number of the average of the absolute value of the deviation vector included in a dominant distribution 1002, can be cited.

The matching position determining process S11931*c* is the process for determining the matching position so that the shape matching degree computed by either of the methods (1) to (3) of the shape matching degree computation process S11931*b* becomes a maximum. The state wherein the matching position determining process S11931*c* is finished is hereinafter referred to as "a position matching finished state".

As described above, after position matching and computation of the shape matching degree with the inspection shape 201 are performed on respective comparison shape of the comparison shape set 302, a comparison shape for defect inspection determining process S11932 is performed. In the comparison shape for defect inspection determining process S11932, a comparison shape wherein the shape matching degree against the inspection shape 201 becomes a maximum among a plurality of comparison shapes of the comparison shape set 302 is selected as the comparison shape for defect inspection. Deformation quantity information 601 for this selected comparison shape wherein the shape matching degree against the inspection shape 201 becomes a maximum and deviation vector set 602 between the inspection object circuit pattern 201 and the comparison shape for defect inspection are output to the defect detection and classification section 1194 as output information 600.

Although a method wherein shape comparison is performed by the deviation vector set is described in the present embodiment, comparison by image information may be performed. For example, position matching and quantification of the shape matching degree are possible by, after the outlines of the inspection object circuit pattern and the comparison shape are converted to multi-valued images and subjected to flattening, computation of the correlation value.

[Defect Detection and Classification Section]

In the defect detection and classification section 1194 shown in FIG. 1, the shape deviation quantity between the inspection object circuit pattern and the comparison shape for defect inspection by receiving output information 600 from the shape comparison section 1193 are computed, and detection of the defect is performed using either one or both of the deformation quantity information and the shape deviation quantity. Detection of the defect is performed in accordance with a given defect detection rules, and the defect detection rules include a rule that whether or not the comparison shape for defect inspection is included in the normal shape range is to be made a criterion.

Here, (1) the deviation vector set along the outline between the inspection object circuit pattern and the comparison shape for defect inspection is computed as the shape deviation quantity, and (2) the normal shape range is represented by a boundary stipulated in the space of the shape variation formed by shape variation according to the respective shape deformation rule.

In detection of the defect, whether the comparison shape for defect inspection is within the normal shape range is made a criterion, and in addition, even if the comparison shape for defect inspection is within the normal shape range, judgment of defect is possible according to the deviation vector set.

Further, the defect inspection and classification section 1194 is a process step for classifying the defect caused in the inspection object circuit pattern according to respective occurrence factor by comparison between the comparison shape for defect inspection obtained in the shape comparison section and the inspection object circuit pattern, either one or both of the deformation quantity information added to the comparison shape for defect inspection and the shape deviation quantity is used, and defect classification is performed in accordance with the defect classification rules relating them. Also, the classification here includes the same by (a) one or more supposed defect occurrence factors supposed, or (b) non-supposed defect occurrence factor.

With reference to (a) described above, formation of the comparison shape is performed in accordance with one or more shape deformation rules and the shape deformation rules are linked with the supposed defect occurrence factor, therefore degree of shape deformation of the inspection object circuit pattern according to the respective supposed defect occurrence factor can be presumed when the comparison shape for defect inspection against the inspection object circuit pattern is decided, and the classification becomes possible.

With reference to (b) described above, if the shape deviation quantity is large, it is possible to presume that the inspection object circuit pattern includes a supposed defect occurrence factor. Also, the defect by these non-supposed defect occurrence factors can be classified to further detailed classes with a criterion of the deviation vector set.

As an embodiment for realizing defect detection and classification as described above, a procedure for detecting and classifying 4 defect modes of A to D with different countermeasure contents respectively will be described referring to FIG. 11.

Mode A1101 and mode B1102 are of the cases wherein the shape deformation is within a supposed range and resemblance degree between the inspection object circuit pattern and the comparison shape for defect inspection is a predetermined level or above. Out of them, the mode A1101 is of the case wherein comparison shape for defect inspection 302$n$ is within the normal shape range and in the state without a defect.

The mode 1102 is of the case wherein comparison shape for defect inspection 302$n'$ is out of the normal shape range and is a systematic defect by abnormality of exposure condition (an abnormal exposure condition defect). The systematic defect means the defect occurring repeatedly in a plurality of dies and chips by process variation and an inferior mask.

Modes C1103 and D1104 are modes wherein a peculiar shape deviation occurs between the inspection shape 201 and a part of comparison shape for defect classification 302$n''$ and 302$n'''$, and are of the case wherein the shape deformation is out of a supposed range and resemblance degree between the inspection object circuit pattern and the comparison shape for defect inspection is below a predetermined level. Although such defects are regarded as the defects by a non-supposed defect occurrence factor, in the present embodiment, they are classified to a systematic defect by an inferior mask pattern (mode C1103) and a random occurrence defect (mode D1104) by the deviation vector set.

The main factor of the defect of the mask pattern is an error in presuming optical proximity effect in mask design, and adjustment of mask OPC (optical proximity correction) is performed as a countermeasure. The random occurrence defect means the defect occurring at random locations by a foreign matter in the semiconductor manufacturing process and the like, regardless of the mask pattern and process variation. As the countermeasures for such kind of defect, foreign matter control in a mask shaping process and an exposure process can be cited.

Next, a defect detection and classification procedure based on the defect modes will be described referring to FIG. 12. For defect classification, deformation quantity information 601 output in the shape comparison section 1193 and giving the comparison shape for defect inspection, and the deviation vector set 602 between the inspection object circuit pattern 201 and the comparison shape for defect inspection, are used.

Firstly, a first judgment S11941 is performed for the defect classification object pattern 201. The first judgment S11941 is the judgment whether the comparison shape for defect inspection is within the normal shape range or not using the deformation quantity information applied in forming the comparison shape for defect inspection, and, when the comparison shape for defect inspection is judged to be out of the normal shape range (divergence "No" in S11941), the defect is classified to the defect kind having the mode B, and when judged to be within the normal shape range, the defect is classified to the defect kind not having the mode B. Here, the normal shape range is determined beforehand considering the affect the shape deformation of respective shape deformation rule brings to the device characteristics and the like.

Then, a second judgment S11942 is performed. The second judgment S11942 is the judgment whether there is a peculiar shape deviation or not by a deviation vector set 602 between the inspection object circuit pattern 201 and the comparison shape for defect inspection. When the peculiar shape deviation is judged to be present, the portion where such peculiar shape deviation occurs is extracted as a defect portion by a third judgment S11943. For the method for extracting the defect portion, a method wherein the region where the deviation vector becomes a given value or above for a given number of times or above continuously is made the defect portion and the like can be cited. Then, a defect mode C or D is applied using a row of the deviation vector in the vicinity of the portion. Below, two methods for performing the third judgment S11943 will be described.

(1) Method by Differential Value of Vector Length

Figure 13A:
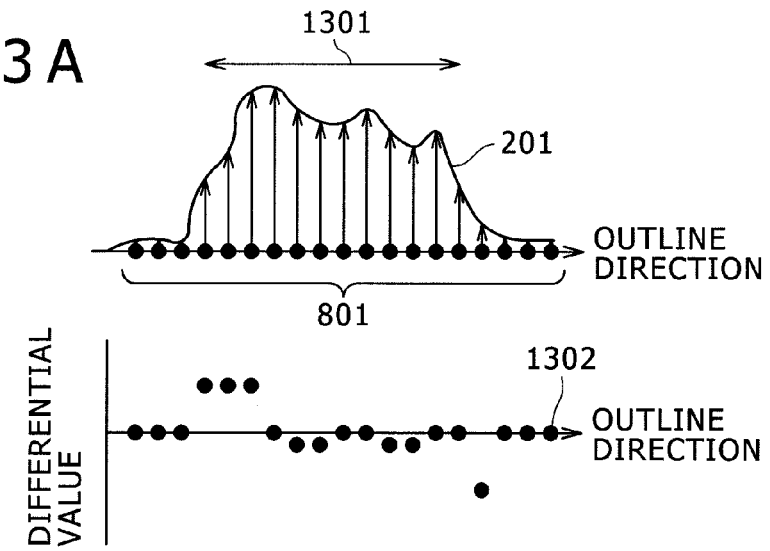
FIG. 13A is a drawing arranging the deviation vectors in the direction of the outline of a pattern and showing the differential value of the vector length.
Figure 13B:
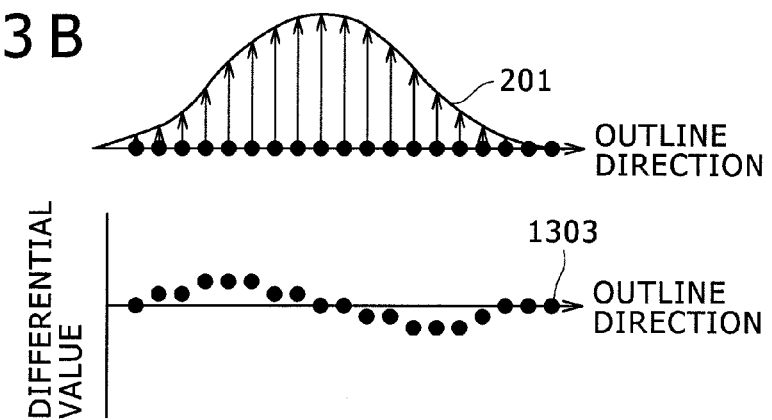
FIG. 13B is a drawing arranging the deviation vectors in the direction of the outline of a pattern including a defect belonging to the mode C and showing the differential value of the vector length.
Figure 13C:
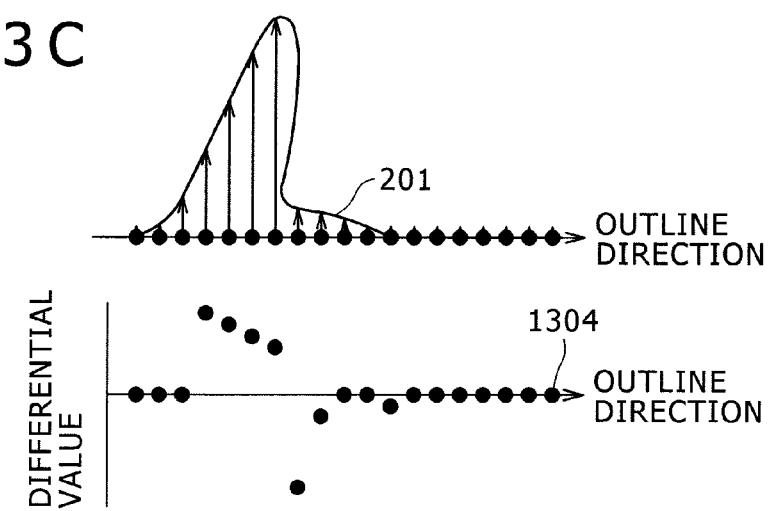
FIG. 13C is a drawing arranging the deviation vectors in the direction of the outline of a pattern including a defect belonging to the mode D and showing the differential value of the vector length.

As shown in FIG. 13A, the deviation vectors are arranged in the direction of the outline of the pattern, and differential values 1302 of the vector lengths around and inside a deviation vector row 1301 corresponding to the defect portion are computed. In the defect belonging to the mode C, shape deviation in the defect portion varies smoothly, and absolute values of the differential values are within a small range (FIG. 13B). On the other hand, in the defect belonging to the mode D, there is a portion where variation of the dimension of the deviation vector in the defect portion is sharp, and sharp variation can be detected by setting a threshold value for the absolute value of the differential value (FIG. 13C). Thus, when the differential value where the absolute value becomes a certain threshold value or above around and inside the deviation vector row 1301 corresponding to the defect portion is not present, the defect is applied to the defect mode C, and when present, the defect is applied to the defect mode D.

(2) Method by Relation of Neighboring Deviation Vector

Figure 14:
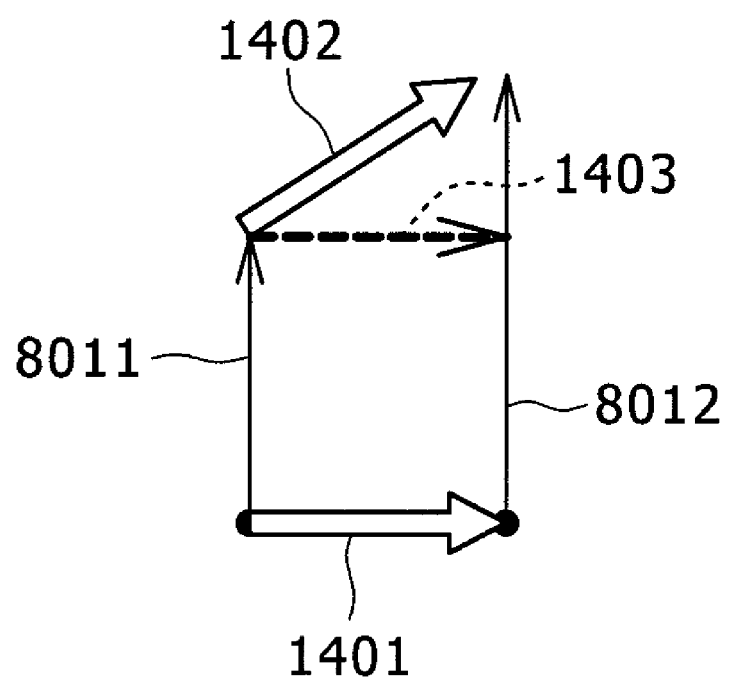
FIG. 14 is an explanatory drawing of the computing process of shape deviation feature quantity.

As shown in FIG. 14, the deviation vectors are arranged in the direction of the outline of the pattern, and a vector 1401 connecting the start points of neighboring vectors (hereinafter referred to as "a vector between start points") and a vector 1402 connecting the end points (hereinafter referred to as "a vector between end points") are computed. Then, a component 1403 of the vector between end points 1402 parallel to the vector between start points 1401 is computed. The mode C is the classification assuming the defects occurring by unsuitable OPC (optical proximity correction) against the mask, and in these defects, as shown in the example of the mode C of FIG. 11, the outline in the defect portion has generally same directional components with an ideal shape without a defect. On the other hand, in the mode D, the outline in the defect portion has directional components unrelated with the ideal shape. Thus, when the scalar ratio of the parallel component 1403 against the vector between end points 1402 always is a certain value or above around the defect portion, the defect is applied to the defect mode C, and if not, to the mode D.

In performing the third judgment S11943 by the methods shown in (1) and (2) described above, not only the deviation vector set but also the attribute information at the point obtained using the design data may be used jointly. Examples of the attribute information are shown in FIG. 16. No. 1601 shows an example of dividing a design shape line into an attribute a (without OPC) and an attribute b (with OPC), and by joint use of these attribute information and deviation vector set, accuracy of mode decision can be improved. For example, in an example of the shape deviation (1) of FIG. 16, the deviation vectors are large in the section of the attribute b with OPC, therefore the defect can be made the shape deviation by a mask defect (the mode C). On the other hand, in an example of the shape deviation (2), the deviation vectors are large in the section of the attribute a without OPC, therefore the defect can be made the shape deviation by a random factor (the mode D).

By considering the defect mode as described above, as shown in FIG. 12, not only the classification corresponding to the defect mode A to D respectively but also the classification of the defect of combination of the mode B and mode C as well as the defect of combination of the mode B and mode D are possible.

In the judgment of No. S11944, classification reliability computed considering whether there is significant difference between the value for evaluation used for judgment and the threshold value for judgment in the first judgment S11941, the second judgment 11942 and the third judgment 11943 is evaluated, and when it is lower than a predetermined criterion, the classification result is made "unclear". Thus, automatic classification is performed only when the classification reliability is high, and classification is entrusted to the user when the classification reliability is low, thereby manual return by classification mistake can be decreased. Also, defect classification performance can be improved by collation of the detected and classified defect between dies or between wafers. For example, re-classification may be performed if the defect occurs commonly in the majority of the die or wafer.

Figure 19:
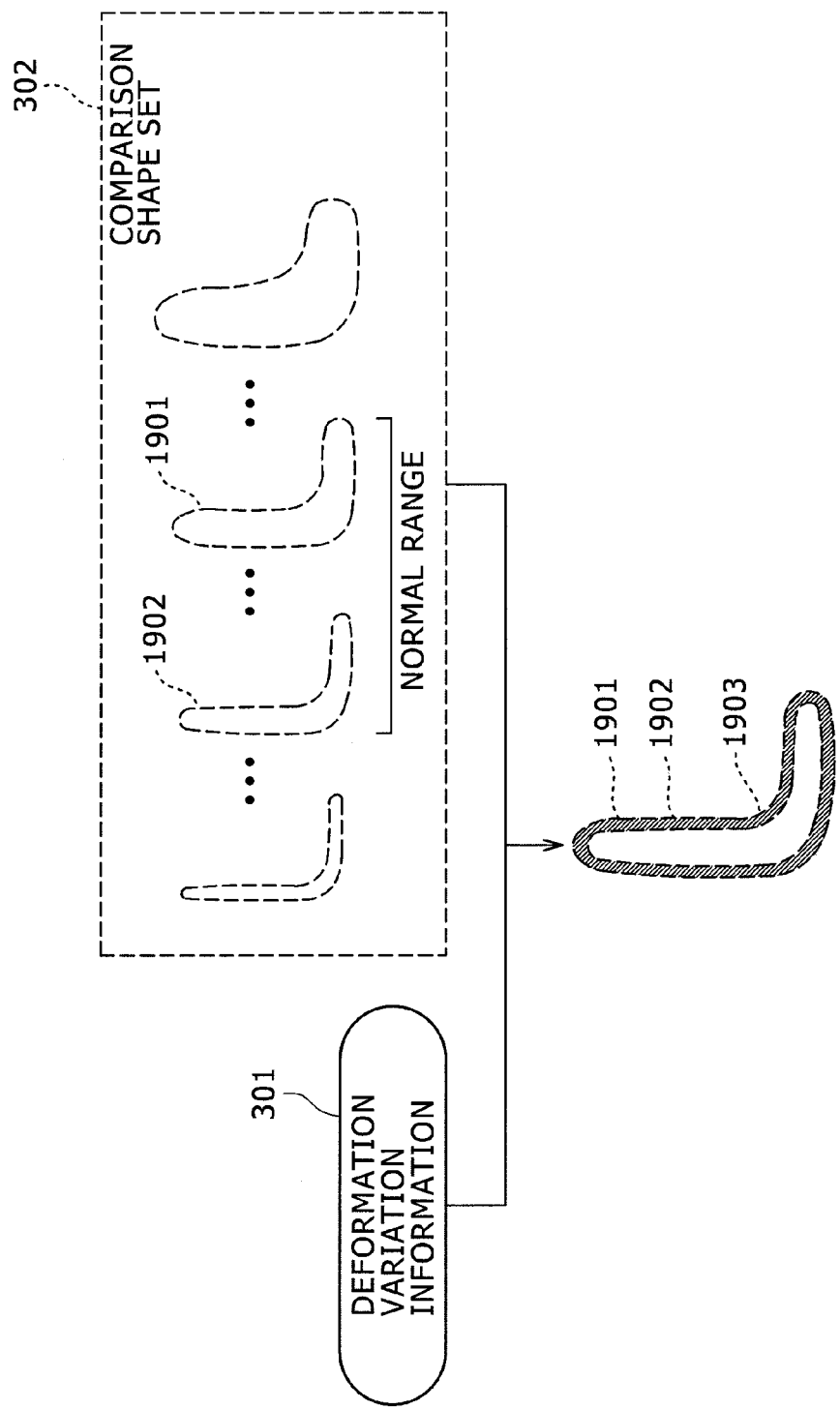
FIG. 19 is a drawing showing a method for determining the normal deformation range.

Also, in the first judgment S11941, as shown in FIG. 19, range 1903 for presence of outline judged as a normal shape is formed using boundary values 1901 and 1902 of the normal shape range of the comparison shape set 302, thereby the inspection object circuit pattern 201 is normal or not may be judged by whether the inspection object circuit pattern is included or not in the range of presence 1903. Thus, the range of the normal shape is defined and is compared directly with the inspection object circuit pattern, thereby accuracy of classification in the judgment is improved.

Figure 15:
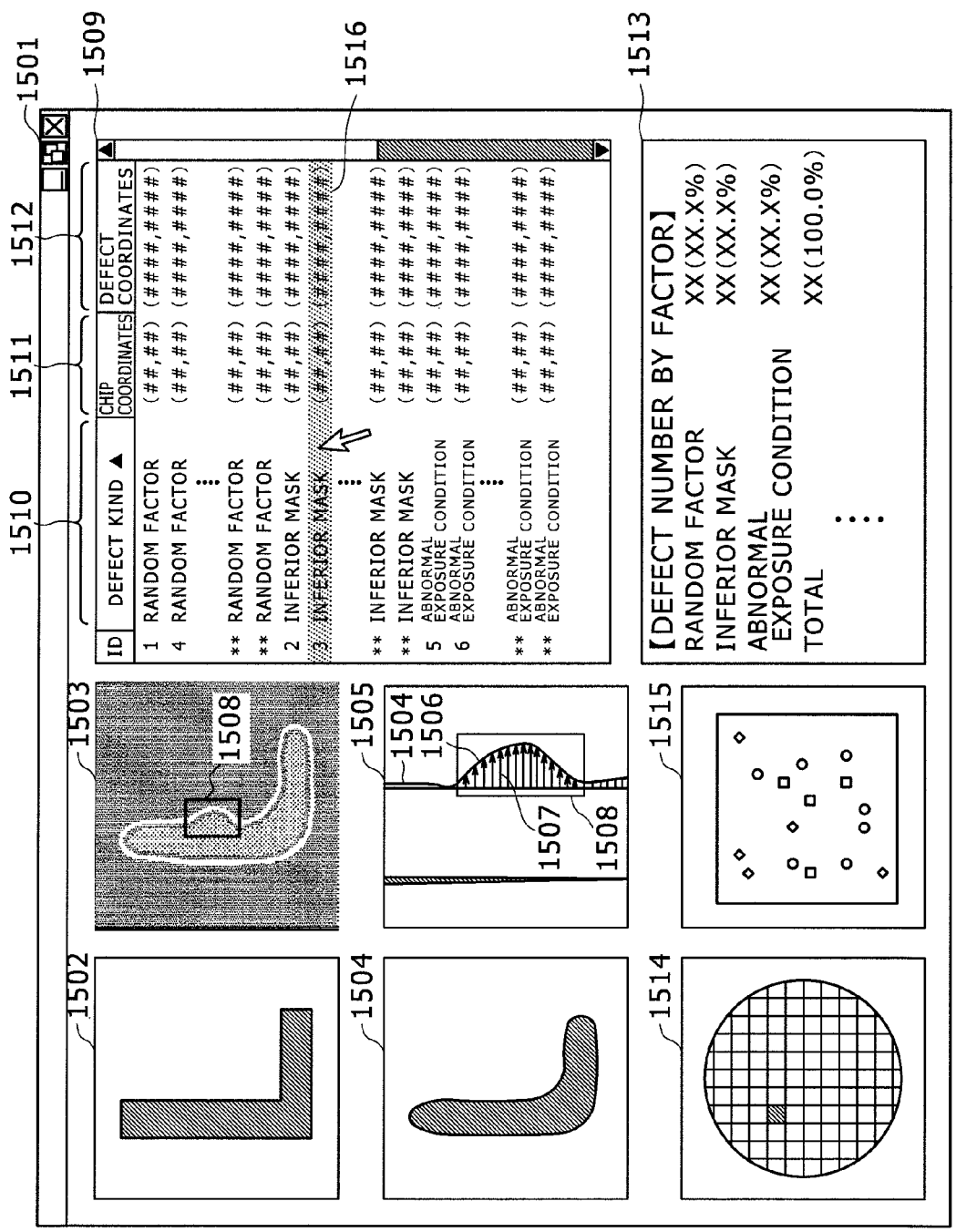
FIG. 15 is a drawing showing an inspection result displaying GUI.

The result of defect inspection and defect classification 117 by the inspection performed in accordance with the procedure described above may be stored in the storage device 112 or may be displayed on the display 114. An example of display is shown in FIG. 15. On a GUI screen 1501, circuit design data 1502, an inspection object circuit pattern image 1503, a comparison shape for defect inspection 1504, and a shape comparison display 1505 including an inspection object circuit pattern 1506, a deviation vector set 1507 and a defect portion 1508, are displayed graphically.

Also, a list 1509 of the defect included in the inspection object comprising a defect kind 1510 and defect locations 1511, 1512, statistical information 1513 totaling the defect list 1509, a chip map 1514 showing the chip of the inspection object, and defect distribution 1515 for respective classification kind of the inspection object chips, are also displayed. By displaying the information for the user, countermeasures on the process can be implemented speedily and efficiently.

Further, as shown in No. 1516, if the defect portion corresponding to either one item pointed out of the defect list 1509 is arranged to be displayed, it will be helpful for grasping the defect information.

Furthermore, the present invention can be applied to a mask inspection as well. For example, in inspecting a pattern formed on a mask substrate, similarly to the embodiment described above, a comparison shape set is formed considering the pattern deformation possible to occur in mask pattern drawing and the inspection object pattern is compared with it, thereby defect detection and classification can be performed, and the effect similar to above can be obtained.

As described above, in accordance with the present embodiment, defect detection and classification can be performed highly accurately for supposed defect occurrence factors, and detailed defect classification can be performed for non-supposed defect occurrence factors as well.

Embodiment 2

As Embodiment 2, an embodiment will be described wherein variation of exposure condition and an error in an overlay position occurring between layers are made supposed defect occurrence factors, and detection and classification are performed with respect to an abnormal exposure condition defect, an overlay position error defect, and a defect caused by a plurality of non-supposed defect occurrence factors. As the present embodiment is similar to Embodiment 1 with respect to apparatus constitution and process steps, only the points different in processing contents will be described.

Figure 20:
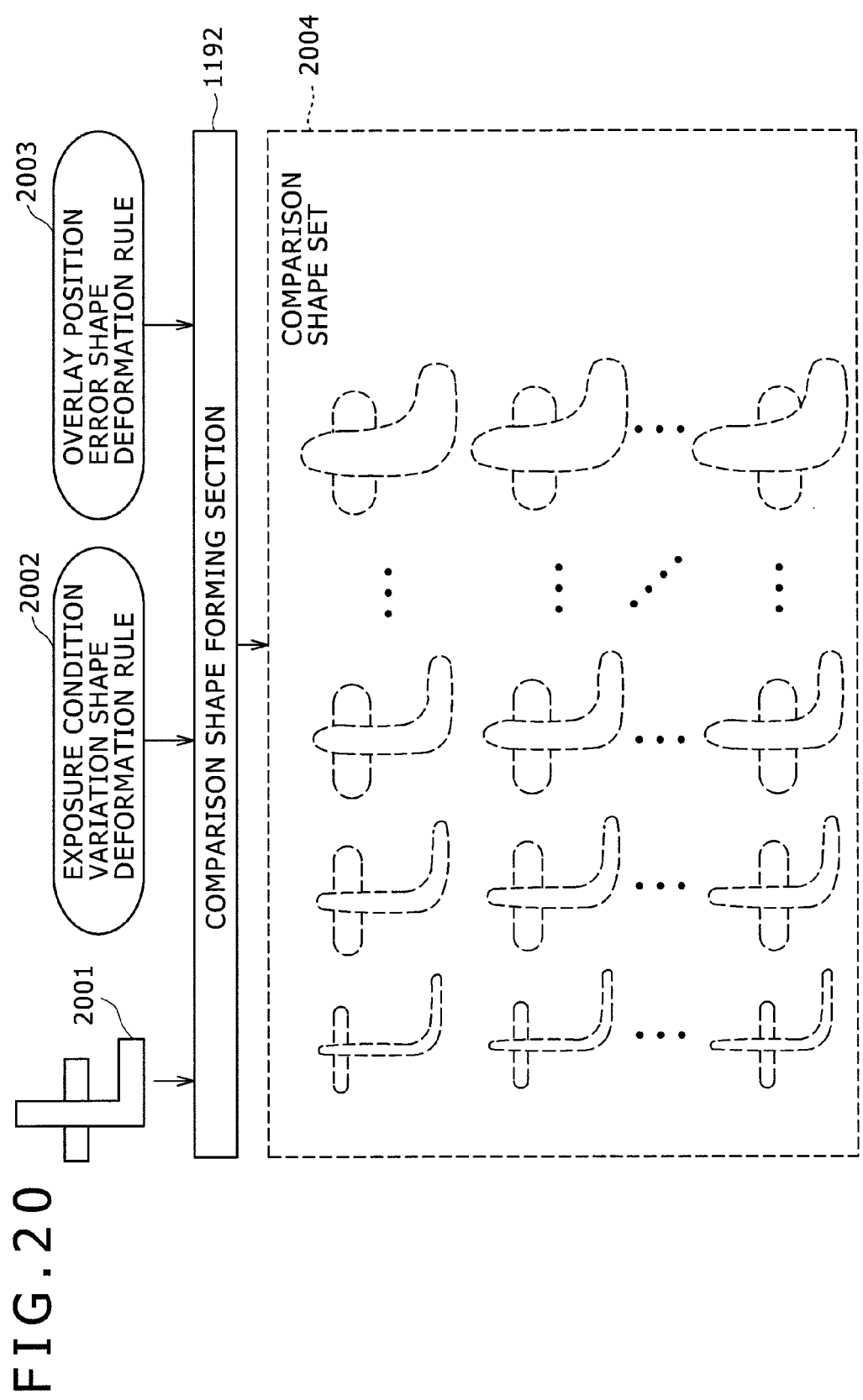
FIG. 20 is a drawing showing a process for forming a comparison shape set by shape deformation according to a plurality of deformation rules.

FIG. 20 is an explanatory drawing of a comparison shape forming section in accordance with the present embodiment. Here, explanation will be made using double layer design data. Based on design data 2001, a comparison shape set 2004 is formed by the comparison shape forming section 1192. At this time, shape deformation is performed in accordance with an exposure condition variation shape deformation rule 2002 considering variation of the exposure condition and a shape deformation rule 2003 linked with an error of an overlay position of double layer circuit (hereinafter referred to as "an overlay position error shape deformation rule"), and a comparison shape set 2004 is formed to cover the variation of both.

Figure 21:
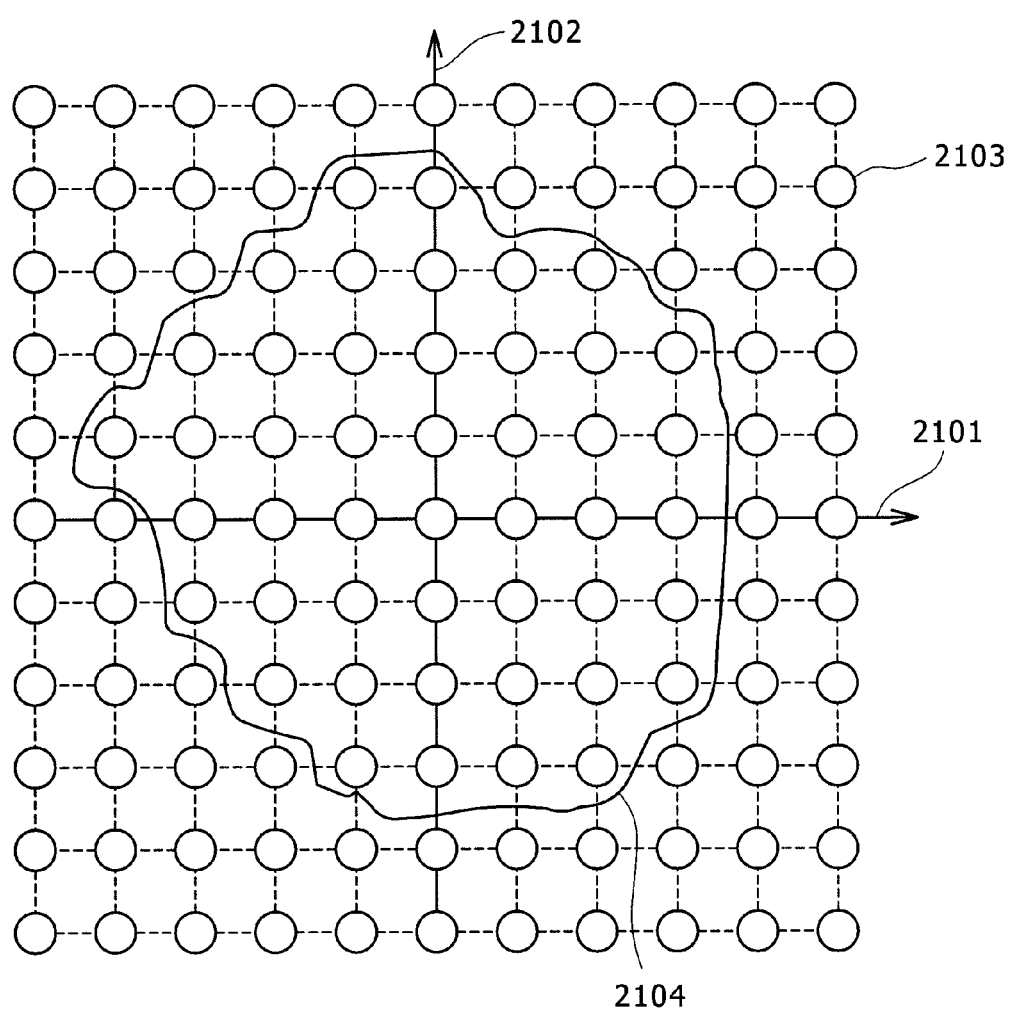
FIG. 21 is a drawing explaining the normal shape range.

Normal shape range for defect inspection is determined beforehand considering the affect the shape deformation of respective shape deformation rule brings to the device characteristics and the like. FIG. 21 is a schematic drawing of the normal shape range. The drawing shows the shape variation by the exposure condition variation shape deformation rule by an axis 2101, the shape variation by the overlay position error shape deformation rule by an axis 2102, one of the comparison shapes formed by a plurality of shape deformation rules by 2103, and an example of a normal shape range by 2104 respectively.

Figure 22:
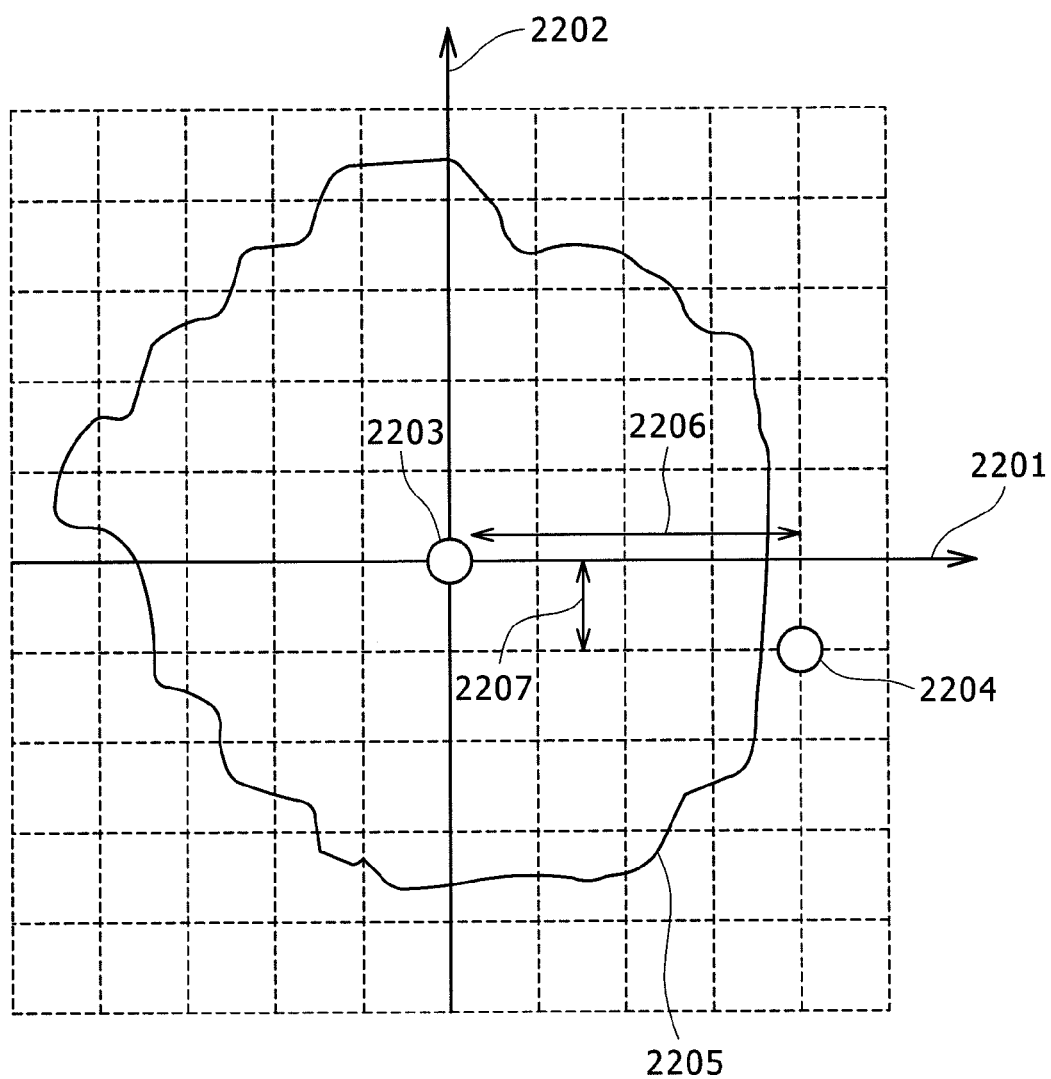
FIG. 22 is a drawing explaining the concept of the defect occurrence factor presuming procedure.

With respect to defect classification, the defect caused by a supposed defect occurrence factor is classified according to respective defect occurrence factor based on deformation quantity information. FIG. 22 is a schematic drawing of classification according to respective defect occurrence factor and illustrates the deformation added to a comparison shape for defect inspection 2204 based on a shape 2203 which becomes the criterion. Here, because shape deformation 2206 by an exposure condition variation shape deformation rule is conspicuous compared with shape deformation 2207 by the overlay position error shape deformation rule, it is known that the main defect occurrence factor of the inspection object circuit pattern is the variation of the exposure condition.

Also, with respect to the defect caused by a non-supposed defect occurrence factor, similarly to the method of classifying to a systematic defect by an inferior mask pattern and a random occurrence defect described in Embodiment 1, detailed classification is possible by analyzing the deviation vector set.

In accordance with the present embodiment, degree of shape deformation according to respective factor can be grasped with respect to supposed defect occurrence factors, and priority of the countermeasure process can be decided.

Embodiment 3

Figure 17:
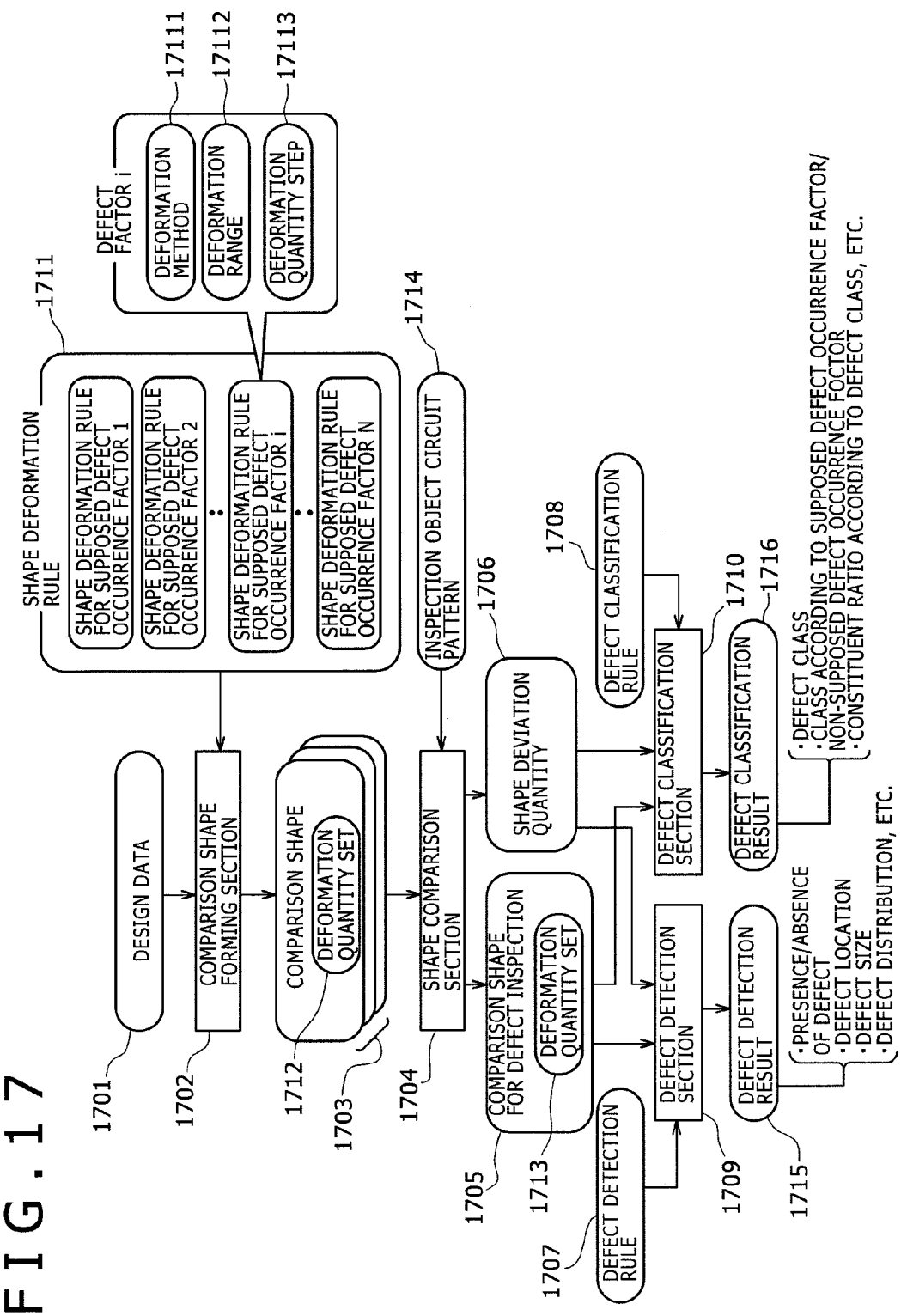
FIG. 17 is a conceptual drawing of a defect inspecting process section.

As Embodiment 3, an embodiment will be described referring to FIG. 17 wherein defect detection and classification is performed when the number of supposed defect occurrence factors is made optional.

First, in a comparison shape forming section 1702, a comparison shape set 1703 is formed based on design data 1701. The comparison shape set 1703 is a group of a plurality of shapes added with deformation according to predetermined shape deformation rules 1711. The shape deformation rules 1711 are to stipulate a deformation method 17111 of the design data (information on deformation variation such as a deformation range 17112, and deformation quantity step 17113, for example) according to respective supposed defect occurrence factor such as variation of exposure condition, an error of an overlay position occurring between layers, and an overlay error in a multi-layer pattern, and can stipulate any number of variations. A deformation quantity set 1712 is an optional combination of deformation quantity which is formed by changing the deformation quantity for the respective shape deformation rule 1711, and is formed for respective comparison shape formed.

Next, in a shape comparison section 1704, respective shape of the comparison shape set 1703 and an inspection object circuit pattern 1714 are compared respectively, and a comparison shape for defect inspection 1705 whose shape is most similar to that of the inspection object circuit pattern is selected out of the comparison shape set 1703. Also, a shape deviation quantity 1706, which is the shape difference between the inspection object circuit pattern 1714 and the comparison shape for defect inspection 1705, is computed.

A defect detection section 1709 performs defect detection using either one or both of a deformation quantity set 1713 and a shape deviation quantity 1706 corresponding to the comparison shape for defect inspection 1705 in accordance with defect detection rules 1707 relating them. A defect detection result 1715 includes either one, a plurality or all out of; presence or absence of a defect, position of a defect, size of a defect, and defect distribution. The examples of the defect detection rules are shown in (1) to (3) below.

(1) Rule by Deformation Quantity Set

Presence or absence of a defect is judged by whether the comparison shape for defect inspection 1705 is included or not in the normal shape range stipulated beforehand with respect to the comparison shape set 1703 using the deformation quantity set 1713. Here, the normal shape range is determined beforehand considering the affect the shape deformation of respective shape deformation rule brings to the device characteristics and the like.

(2) Rule by Shape Deviation Quantity

Presence or absence of a defect is judged by computing a deviation vector set as the shape deviation quantity 1706 and detecting a deviation vector exceeding a predetermined dimension. Also, in accordance with this method, not only presence or absence of the defect but also the portion of the defect in the inspection object circuit pattern can be determined.

(3) Rule by Both of Deformation Quantity Set and Shape Deviation Quantity

The rules (1) and (2) described above are applied consecutively, and when a defect is detected by either one of the rules, the defect is judged to be present.

A defect classification section 1710 performs defect classification using either one or both of the deformation quantity set 1713 and the shape deviation quantity 1706 in accordance with defect classification rules 1708 relating them. A defect classification result 1716 includes either one, a plurality or all out of; a defect class, a defect class according to respective supposed defect occurrence factor and non-supposed defect occurrence factor, and constituent ratio of respective defect class within a predetermined inspection region.

The examples of the defect classification rules are shown in (1) to (3) below.

(1) Rule by Deformation Quantity Set

Degree of the affect of the respective supposed defect occurrence factor on formation of an inspection object circuit pattern is obtained using the deformation quantity set 1713, and the defect is classified by defect occurrence factor to a defect kind including, for example, respective defect mode and combination thereof shown in FIG. 11.

(2) Rule by Shape Deviation Quantity

Classification is performed by computing a deviation vector set as the shape deviation quantity 1706, and using the dimension and distribution of a row of deviation vectors or the variation pattern of the dimension and distribution of the row of deviation vectors in the outline direction of the inspection object circuit pattern.

(3) Rule by Both of Deformation Quantity Set and Shape Deviation Quantity

First, resemblance degree between the inspection object circuit pattern and the comparison shape for defect inspection is computed. If the resemblance degree is a predetermined level or above, the defect caused by a supposed defect occurrence factor is classified by the rule (1) described above, and if the resemblance degree is below the predetermined level, the defect caused by a non-supposed defect occurrence factor is classified by the rule (2) described above.

Thus, by formation of the comparison shape in accordance with an optional numbers of shape deformation rules, degree of affect of the defect occurrence factor brought to the inspection object circuit pattern can be grasped, and priority of countermeasure process can be decided.

In accordance with the present embodiment, countermeasure items for the process can become easy to be sorted out with the result that measures to failures can be made speedy.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An apparatus for inspecting a defect of a circuit pattern formed on a semiconductor wafer comprising:
    SEM image obtaining means for obtaining a SEM image of an inspection region on the semiconductor wafer formed with the circuit pattern;
    defect inspecting and classifying means for comparing the SEM image of the inspection region obtained by the SEM image obtaining means with a reference image, and for classifying the SEM image of the inspection region on the semiconductor wafer; and
    an outputting means for outputting results classified by the defect inspecting and classifying means;
    wherein the defect inspecting and classifying means further comprises:
    comparison shape forming means for forming a plurality of comparison shapes corresponding to the SEM image of the inspection region by deforming the shape of the circuit pattern in accordance with a plurality of shape deformation rules using design data corresponding to the circuit pattern within the inspection region, and for selecting a shape similar to the SEM image of the inspection region out of the plurality of comparison shapes formed as the comparison shape; and
    shape comparing and classifying means for classifying the SEM image using information of the comparison shape selected in the comparison shape forming means and the inspection shape of the circuit pattern of the SEM image of the inspection region.

2. The inspection apparatus as set forth in claim 1, wherein;
    in the comparison shape forming means, the plurality of shape deformation rules are linked with defect occurrence factors.

3. The inspection apparatus as set forth in claim 1, wherein;
    in the comparison shape forming means, deformation of the shape of the circuit pattern is performed including either of enlargement and reduction of pattern width, enlargement and size reduction of the entire pattern shape isotropically or in a specific direction, or addition of roundness at corner sections with respect to the design data.

4. The inspection apparatus as set forth in claim 3, further comprising:
    an inputting means for inputting range of deformation quantity to deform the shape of the circuit pattern in the comparison shape forming means.

5. The inspection apparatus as set forth in claim 1, wherein;
    in the comparison shape forming means, deformation of the shape of the circuit pattern is performed using exposure simulation.

6. The inspection apparatus as set forth in claim 1, wherein;
    in the comparison shape forming means, the plurality of the comparison shapes are formed incorporating variation of pattern width, variation of enlargement and size reduction of an image, variation of pattern length, variation of curvature of corners of a pattern, and variation of flattening process with respect to the design data corresponding to the circuit pattern.

7. The inspection apparatus as set forth in claim 1, wherein;
    the shape comparing and classifying means has a defect occurrence factor classifying means for classifying the SEM image of the inspection region according to respective defect occurrence factors.

8. The inspection apparatus as set forth in claim 1, wherein;
    in the shape comparing and classifying means, deviation quantity of the shape between the shape of the circuit pattern of the SEM image of the inspection region and the shape of the comparison shape is computed, and the SEM image is classified using at least either one of information of deformation added to the comparison shape and information of the deviation quantity of the shape.

9. A method for inspecting a defect of a circuit pattern formed on a semiconductor wafer comprising the steps of:
    obtaining a SEM image of an inspection region on the semiconductor wafer formed with the circuit pattern;
    inspecting and classifying the SEM image of the inspection region on the semiconductor wafer by at least comparing the obtained SEM image of the inspection region with a reference image and obtaining a classified result; and
    outputting the classified result;
    wherein the step for inspecting and classifying the SEM image further comprises the steps of:
    forming a plurality of comparison shapes corresponding to the extracted inspection shape by deforming the shape of the circuit pattern in accordance with a plurality of shape deformation rules using design data corresponding to the circuit pattern within the inspection region and selecting a shape similar to the SEM image of the inspection region as a comparison shape out of the plurality of comparison shapes formed; and
    classifying the SEM image using information of the selected comparison shape and the inspection shape of the circuit pattern of the SEM image of the inspection region.

10. The method for inspecting as set forth in claim 9, wherein;
    in the step for selecting the comparison shape, the plurality of shape deformation rules are linked with defect occurrence factors.

11. The method for inspecting as set forth in claim 9, wherein;
    in the step for selecting the comparison shape, deformation of the shape of the circuit pattern is performed including either of enlargement and reduction of pattern width, enlargement and size reduction of the entire pattern shape isotropically or in a specific direction, or addition of roundness at corner sections with respect to the design data.

12. The method for inspecting as set forth in claim 11, wherein;
in the step for selecting the comparison shape, the range of the deformation quantity for deforming the shape of the circuit pattern is input on a GUI screen.

13. The method for inspecting as set forth in claim 9, wherein;
in the step for selecting the comparison shape, deformation of the shape of the circuit pattern is performed using exposure simulation.

14. The method for inspecting as set forth in claim 9, wherein;
in the step for selecting the comparison shape, the plurality of comparison shapes are formed incorporating variation of pattern width, variation of enlargement and size reduction of an image, variation of pattern length, variation of curvature of corners of a pattern, and variation of flattening process with respect to the design data corresponding to the circuit pattern.

15. The method for inspecting as set forth in claim 9, wherein;
in the step for classifying the SEM of the defect, the SEM image of the inspection region is classified according to respective defect occurrence factors.

16. The method for inspecting as set forth in claim 9, wherein;
in the step for classifying the SEM image of the inspection region, deviation quantity of the shape between the shape of the circuit pattern of the SEM image of the inspection region and the comparison shape is computed, and an image of the SEM image is using at least either one of classifying information of deformation added to the comparison shape and information of the deviation quantity of the shape.

* * * * *